US011133069B2

(12) United States Patent
Kim

(10) Patent No.: US 11,133,069 B2
(45) Date of Patent: Sep. 28, 2021

(54) MEMORY CONTROLLER TO DETERMINE AN OPTIMAL READ VOLTAGE, OPERATING METHOD THEREOF AND STORAGE DEVICE INCLUDING THE SAME

(71) Applicant: SK hynix Inc., Gyeonggi-do (KR)

(72) Inventor: Yu Mi Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 162 days.

(21) Appl. No.: 16/415,695

(22) Filed: May 17, 2019

(65) Prior Publication Data

US 2020/0105350 A1    Apr. 2, 2020

(30) Foreign Application Priority Data

Oct. 1, 2018    (KR) .................. 10-2018-0117205

(51) Int. Cl.

| | |
|---|---|
| *G06F 13/00* | (2006.01) |
| *G11C 16/26* | (2006.01) |
| *G06F 11/10* | (2006.01) |
| *G11C 29/52* | (2006.01) |
| *G06F 3/06* | (2006.01) |
| *G11C 11/56* | (2006.01) |
| *G11C 16/04* | (2006.01) |

(52) U.S. Cl.
CPC ............ *G11C 16/26* (2013.01); *G06F 3/0619* (2013.01); *G06F 3/0659* (2013.01); *G06F 3/0679* (2013.01); *G06F 11/1068* (2013.01); *G11C 29/52* (2013.01); *G11C 11/5642* (2013.01); *G11C 16/0483* (2013.01)

(58) Field of Classification Search
CPC ..... G11C 16/26; G11C 29/52; G11C 16/0483; G11C 11/5642; G06F 3/0619; G06F 3/0679; G06F 3/0659; G06F 11/1068
See application file for complete search history.

(56) References Cited

U.S. PATENT DOCUMENTS

| | | | |
|---|---|---|---|
| 8,773,922 B2 * | 7/2014 | Song .................. | G11C 11/5642 365/189.07 |
| 9,698,827 B2 * | 7/2017 | Kim .................. | H03M 13/1575 |
| 10,347,330 B2 * | 7/2019 | Zeng .................. | G11C 11/5642 |

(Continued)

FOREIGN PATENT DOCUMENTS

| | | |
|---|---|---|
| KR | 10-2014-0052691 | 5/2014 |
| KR | 10-2015-0053705 | 5/2015 |

*Primary Examiner* — Jing-Yih Shyu

(74) *Attorney, Agent, or Firm* — IP & T Group LLP

(57) ABSTRACT

A memory controller controlling a memory device including a plurality of memory cells includes a read operation controller performing a soft read operation on the plurality of memory cells by using a plurality of soft read voltages determined based on a default read voltage when a read operation for reading the plurality of memory cells by the default read voltage fails, and reading the plurality of memory cells by using an optimal read voltage determined according to a result of performing the soft read operation, and a read voltage setting circuit determining the optimal read voltage using voltage candidates being soft read voltages corresponding to at least two voltage intervals, among a plurality of voltage intervals determined according to the plurality of soft read voltages, the voltage candidates selected in ascending order of a number of memory cells having threshold voltages belonging to each of the plurality of voltage intervals.

19 Claims, 18 Drawing Sheets

(56) References Cited

U.S. PATENT DOCUMENTS

| | | | |
|---|---|---|---|
| 10,424,383 B1* | 9/2019 | Hsiao | G11C 11/5628 |
| 2011/0038205 A1* | 2/2011 | Chou | G11C 16/26 |
| | | | 365/185.03 |
| 2014/0119124 A1* | 5/2014 | Kim | G11C 16/3422 |
| | | | 365/185.18 |
| 2015/0131376 A1* | 5/2015 | Tsang | G11C 16/3404 |
| | | | 365/185.03 |
| 2016/0188213 A1* | 6/2016 | Lin | G11C 16/3459 |
| | | | 711/103 |
| 2017/0236592 A1* | 8/2017 | Alhussien | G11C 16/3431 |
| | | | 714/721 |
| 2017/0255385 A1* | 9/2017 | Tokiwa | G06F 3/0634 |
| 2018/0102790 A1* | 4/2018 | Oh | G11C 16/26 |
| 2019/0087264 A1* | 3/2019 | Tokutomi | H03M 13/1111 |
| 2019/0279723 A1* | 9/2019 | Hsiao | G11C 16/26 |
| 2019/0304546 A1* | 10/2019 | Hsiao | G06F 13/4282 |

\* cited by examiner

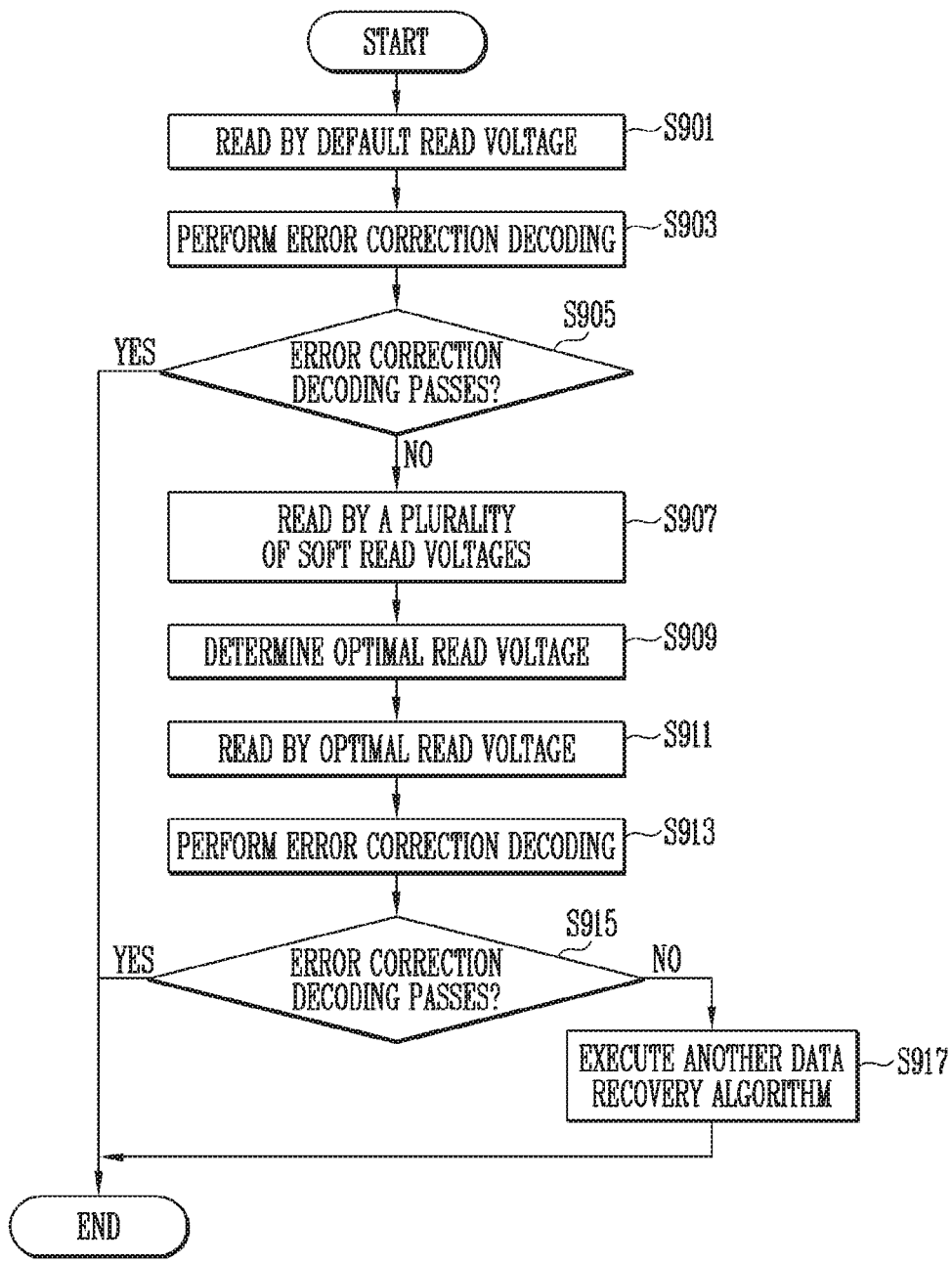

FIG. 14

| INTERVAL | SOFT READ VOLTAGE | DETECTION DATA | INTERVAL DATA | SUM OF DATA OF ADJACENT INTERVALS |
|---|---|---|---|---|
| 1 | Vrs1 | d1 | $|d2-d1|$ = bin1 | - |
| 2 | Vrs2 | d2 | $|d3-d2|$ = bin2 | bin1+bin3 |
| 3 | Vrs3 | d3 | $|d4-d3|$ = bin3 | bin2+bin4 |
| 4 | Vrs4 | d4 | $|d5-d4|$ = bin4 | bin3+bin5 |
| 5 | Vrs5 | d5 | $|d6-d5|$ = bin5 | - |
| - | Vrs6 | d6 | - | - |

FIG. 15

| INTERVAL | SOFT READ VOLTAGE | DETECTION DATA | INTERVAL DATA |
|---|---|---|---|
| 1 | Vrs1 | 100 | 16 |
| 2 | Vrs2 | 116 | 14 |
| 3 | Vrs3 | 130 | 7 |
| 4 | Vrs4 | 137 | 3 |
| 5 | Vrs5 | 140 | 5 |
| - | Vrs6 | 145 | - |

Row 4 ⇒ OPTIMAL READ VOLTAGE

FIG. 16

| INTERVAL | SOFT READ VOLTAGE | DETECTION DATA | INTERVAL DATA |
|---|---|---|---|
| 1 | Vrs1 | 100 | 30 |
| 2 | Vrs2 | 130 | 0 |
| 3 | Vrs3 | 130 | 7 |
| 4 | Vrs4 | 137 | 3 |
| 5 | Vrs5 | 140 | 5 |
| – | Vrs6 | 145 | – |

ERROR OCCURS IN DETECTION DATA (at interval 2, 130)

⇒ WRONGLY SET OPTIMAL READ VOLTAGE (interval 2)

FIG. 17

| INTERVAL | SOFT READ VOLTAGE | DETECTION DATA | INTERVAL DATA | SUM OF DATA OF ADJACENT INTERVALS |
|---|---|---|---|---|
| 1 | Vrs1 | 100 | 30 | |
| 2 | Vrs2 | 130 | 0 | 37 |
| 3 | Vrs3 | 130 | 7 | |
| 4 | Vrs4 | 137 | 3 | 12 |
| 5 | Vrs5 | 140 | 5 | |
| – | Vrs6 | 145 | – | |

⇒ WRONGLY SET OPTIMAL READ VOLTAGE (interval 2)

⇒ CORRECTLY SET OPTIMAL READ VOLTAGE (interval 4)

MEMORY CONTROLLER TO DETERMINE AN OPTIMAL READ VOLTAGE, OPERATING METHOD THEREOF AND STORAGE DEVICE INCLUDING THE SAME

CROSS-REFERENCE TO RELATED APPLICATION

The present application claims priority under 35 U.S.C. § 119(a) to Korean patent application number 10-2018-0117205 filed on Oct. 1, 2018, which is incorporated by reference in its entirety.

BACKGROUND

1. Field of Invention

Various embodiments relate generally to an electronic device and, more particularly, to a storage device and an operating method thereof.

2. Description of Related Art

A storage device may store data in response to control of a host device such as a computer or a smartphone. A storage device may include a memory device for storing data and a memory controller controlling the memory device. Memory devices may be divided into volatile memory devices and non-volatile memory devices.

A volatile memory device may retain data as long as power is being supplied and may lose the stored data in the absence of power supply. Types of the volatile memory device may include Static Random Access Memory (SRAM), Dynamic Random Access Memory (DRAM), and the like.

A non-volatile memory device may not lose data even when a power supply is off. Types of the non-volatile memory device may include Read Only Memory (ROM), Programmable ROM (PROM), Electrically Programmable ROM (EPROM), Electrically Erasable and Programmable ROM (EEPROM) and flash memory.

SUMMARY

Various embodiments of the present disclosure provide a storage device capable of determining an optimal read voltage with more accuracy and an operating method thereof.

In accordance with an embodiment, a memory controller controlling a memory device including a plurality of memory cells may include a read operation controller performing a soft read operation on the plurality of memory cells by using a plurality of soft read voltages determined based on a default read voltage when a read operation for reading the plurality of memory cells by the default read voltage fails, and reading the plurality of memory cells by using an optimal read voltage determined according to a result of performing the soft read operation, and a read voltage setting circuit determining the optimal read voltage using voltage candidates being soft read voltages corresponding to at least two voltage intervals, among a plurality of voltage intervals determined according to the plurality of soft read voltages, the voltage candidates selected in ascending order of a number of memory cells having threshold voltages belonging to each of the plurality of voltage intervals.

In accordance with an embodiment, an operating method for a memory controller controlling a memory device including a plurality of memory cells may include performing a read operation on the plurality of memory cells by using a default read voltage, performing a soft read operation on the plurality of memory cells by using a plurality of soft read voltages determined based on the default read voltage when the read operation fails, determining an optimal read voltage using soft read voltages corresponding to at least two voltage intervals selected in ascending order of a number of memory cells having threshold voltages belonging to each of a plurality of voltage intervals determined according to the plurality of soft read voltages on the basis of a result of performing the soft read operation, and reading the plurality of memory cells by the optimal read voltage.

In accordance with an embodiment, a storage device may include a memory device performing a read operation on a plurality of memory cells and providing a result of performing the read operation, and a memory controller providing the memory device with a read command for instructing a soft read operation on the plurality of memory cells by a plurality of soft read voltages determined based on a default read voltage when a read operation for reading the plurality of memory cells by the default read voltage fails, selecting at least two voltage intervals, among a plurality of voltage intervals determined by the plurality of soft read voltages, as voltage interval candidates in ascending order of a number of memory cells having threshold voltages belonging to each of the plurality of voltage intervals on the basis of a result of performing the soft read operation, determining a soft read voltage corresponding to one of the voltage interval candidates as an optimal read voltage by using a number of memory cells having threshold voltages belonging to voltage intervals adjacent to the voltage interval candidates, and providing the memory device with a command for reading the plurality of memory cells which uses the optimal read voltage.

In accordance with an embodiment, an operating method for a storage device, the method comprising: counting numbers of memory cells having threshold voltages falling within voltage intervals, respectively, the voltage intervals being defined by preliminary read voltages determined with reference to a default read voltage; selecting, as candidates, two or more among the preliminary read voltages according to the counted numbers in ascending order; selecting, as an optimal read voltage among the candidates, a preliminary read voltage of a voltage interval having a smallest sum of the counted numbers of neighboring voltage intervals; and reading the memory cells according to the optimal read voltage.

BRIEF DESCRIPTION OF THE DRAWINGS

FIG. 9 is a flowchart illustrating operations of a storage device in accordance with an embodiment of the present disclosure.

FIG. 14 is a diagram illustrating data for setting an optimal read voltage.

FIG. 15 is a flowchart illustrating an optimal read voltage setting method in accordance with an embodiment of the present disclosure.

FIG. 16 is a diagram illustrating a case in which an optimal read voltage is wrongly set.

FIG. 17 is a diagram illustrating an optimal read voltage setting method in accordance with an embodiment of the present disclosure.

DETAILED DESCRIPTION

Figure 1:
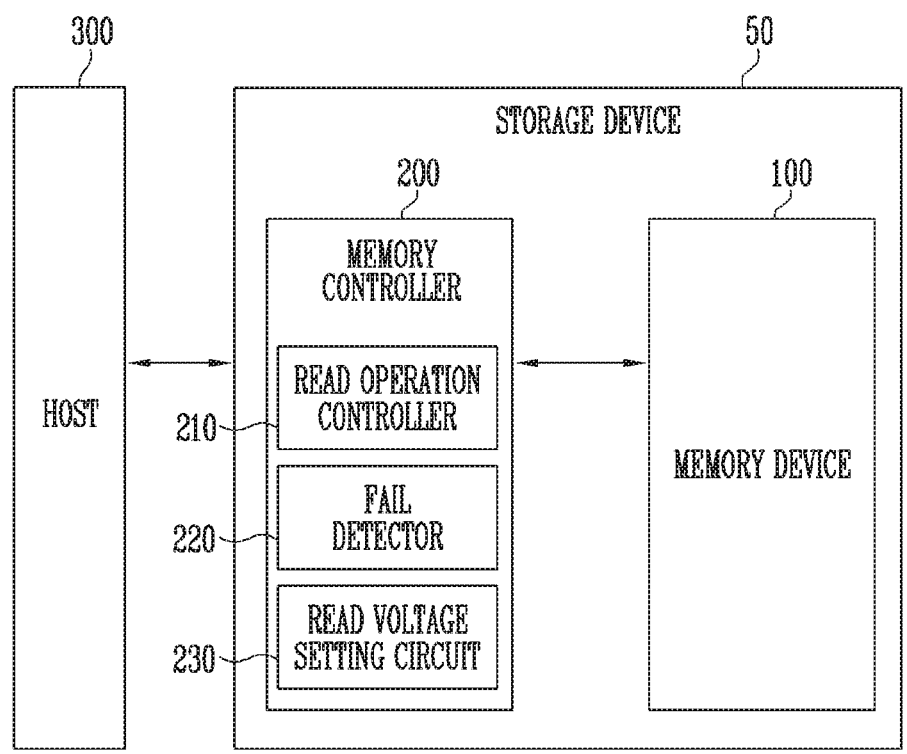
FIG. 1 is a diagram illustrating a storage device in accordance with an embodiment of the present disclosure.

Hereinafter, specific structural or functional descriptions of examples of embodiments in accordance with concepts which are disclosed in this specification are illustrated only to describe the examples of embodiments in accordance with the concepts. The examples of embodiments in accordance with the concepts may be carried out by various forms but the descriptions are not limited to the examples of embodiments described in this specification.

Various modifications and changes may be applied to the examples of embodiments in accordance with the concepts so that the examples of embodiments will be illustrated in the drawings and described in the specification. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terminologies are used to distinguish one component from the other component, for example, a first component may be referred to as a second component without departing from a scope in accordance with the concept of the present disclosure and similarly, a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise. In the present specification, it should be understood that terms "include" or "have" indicate that a feature, a number, a step, an operation, a component, a part or the combination of those described in the specification is present, but do not exclude a possibility of presence or addition of one or more other features, numbers, steps, operations, components, parts or combinations thereof.

So far as not being differently defined, all terms used herein including technical or scientific terminologies have meanings that they are commonly understood by those skilled in the art to which the present disclosure pertains. The terms defined in generally used dictionaries should be construed as having the same meanings as would be construed in the context of the related art, and unless clearly defined otherwise in this specification, should not be construed as having idealistic or overly formal meanings.

In some embodiments, well-known processes, device structures, and technologies will not be described in detail to avoid ambiguousness of the present invention. This intends to disclose the gist of the present disclosure more clearly by omitting unnecessary description.

Hereinafter, exemplary embodiments of the present disclosure will be described in detail with reference to the accompanying drawings in order for those skilled in the art to be able to readily implement the technical spirit of the present disclosure.

FIG. 1 is a diagram illustrating a storage device 50 in accordance with an embodiment of the present disclosure.

Referring to FIG. 1, the storage device 50 may include a memory device 100 and a memory controller 200 controlling operations of the memory device 100. The storage device 50 may be configured to store data in response to a host 300. Examples of the storage device 50 may include a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface corresponding to a communication method with the host 300. For example, the storage device 50 may be configured as any one of various kinds of storage devices such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-e or PCIe) card type storage device, a compact flash (CF) card, a smart media card, a memory stick, and the like.

The storage device 50 may be manufactured by any one of various types of packages. For example, the storage device 50 may be manufactured by any one of various kinds of package types, such as a package-on-package (POP), a system-in-package (SIP), a system-on-chip (SOC), a multi-chip package (MCP), a chip-on-board (COB), a wafer-level fabricated package (WFP), a wafer-level stack package (WSP) and the like.

The memory device 100 may store data. The memory device 100 may operate in response to control of the memory controller 200. The memory device 100 may include a memory cell array including a plurality of memory cells storing data. The memory cell array may include a plurality of memory blocks. Each of the memory blocks may include a plurality of memory cells. Each memory block may include a plurality of pages. In accordance with an embodiment, a page may be a unit for storing data in the memory device 100 or reading data stored in the memory device 100. The memory block may be a unit for erasing data. In an embodiment, examples of the memory device 100 may include a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR) SDRAM, a Rambus Dynamic Random Access Memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). For convenience of description, the memory device 100 is a NAND flash memory.

The memory device 100 may receive a command and an address from the memory controller 200 and access an area selected in response to the address in the memory cell array. That is, the memory device 100 may perform an operation corresponding to the command on the area selected in response to the address. For example, the memory device 100 may perform a write operation (program operation), a read operation, and an erase operation. During a program operation, the memory device 100 may program the area selected by the address with data. During a read operation, the memory device 100 may read data from the area selected by the address. During an erase operation, the memory device 100 may erase data from the area selected by the address.

The memory controller 200 may control the general operations of the storage device 50.

When power is applied to the storage device 50, the memory controller 200 may execute firmware FW. When the memory device 100 is a flash memory device, the memory controller 200 may operate firmware such as a Flash Translation Layer (FTL) for controlling communication between the host 300 and the memory device 100.

In accordance with an embodiment, the memory controller 200 may receive data and a logical block address (LBA) from the host 300 and convert the logical block address (LBA) into a physical block address (PBA) indicating an address of memory cells in which data included in the memory device 100 is stored.

For example, the memory controller 200 may control the memory device 100 so that a program operation, a read operation or an erase operation may be performed in response to a request from the host 300. During a program operation, the memory controller 200 may provide a program command, a physical block address, and data to the memory device 100. During a read operation, the memory controller 200 may provide a read command, a physical block address, and data to the memory device 100. During an erase operation, the memory controller 200 may provide an erase command, a physical block address, and data to the memory device 100.

In accordance with an embodiment, the memory controller 200 may generate and transfer a program command, an address and data to the memory device 100 regardless of a request from the host 300. For example, the memory controller 200 may provide a command, an address and data to the memory device 100 to perform background operations, such as a program operation for wear leveling and a program operation for garbage collection.

In accordance with an embodiment, the memory controller 200 may control at least two memory devices 100. The memory controller 200 may control the memory devices 100 according to an interleaving scheme so as to improve operation performance. The interleaving scheme may be an operating scheme for overlapping operating intervals of at least two memory devices 100.

In accordance with an embodiment, the memory controller 200 may include a read operation controller 210, a fail detector 220 and a read voltage setting circuit 230.

The read operation controller 210 may control a read operation on the memory cells included in the memory device 100. The read operation controller 210 may provide the read command and an address indicating locations of memory cells to read. In accordance with an embodiment, the read operation controller 210 may additionally perform an operation for changing a read voltage before providing the read command to the memory device 100.

The read operation controller 210 may control a read operation for reading the memory cells by default read voltages. The default read voltages may be predetermined voltages for identifying the memory cells programmed into any one of an erase state and a plurality of program states. The memory controller 200 may perform error correction decoding to decode errors included in data read using the default read voltages.

When the error correction decoding passes, original data may be recovered and the read operation may pass. When the error correction decoding fails, the original data may not be recovered and the read operation may fail.

The read operation controller 210 may perform a read operation again by an optimal read voltage having a different voltage level from the default read voltage when the read operation fails. In accordance with an embodiment, to determine an optimal read voltage, the read operation controller 210 may control a soft read operation to read memory cells using a plurality of soft read voltages. The plurality of soft read voltages may be determined based on the default read voltage used during the failed read operation. Error correction decoding may not be performed on data read using the soft read voltages.

The read operation controller 210 may control an operation of reading memory cells by the optimal read voltage determined as a result of performing the soft read operation. Error correction decoding may be performed on data read using the optimal read voltages. When the error correction decoding passes, the data read using the optimal read voltage may be recovered to the original data, and the read operation may pass. When the error correction decoding fails, the data read using the optimal read voltage may not be recovered to the original data, and the read operation may fail.

The fail detector 220 may detect a failure of the read operation. More specifically, the fail detector 220 may detect the failure of the read operation when error correction decoding on the data read using the default read voltage fails. The error correction decoding may pass when the number of error bits included in the read data is less than the number of correctable bits by an error correction decoder. On the other hand, when the number of error bits included in the read data exceeds the number of correctable bits by the error correction decoder, the error correction decoding may fail.

The read voltage setting circuit 230 may acquire soft read data read by the plurality of soft read voltages. The read voltage setting circuit 230 may determine an optimal read voltage using the soft read data. In accordance with an embodiment, the plurality of soft read voltages may correspond to default read voltages. More specifically, the read voltage setting circuit 230 may count memory cells having threshold voltages within respective voltage intervals defined by the plurality of soft read voltages.

The read voltage setting circuit 230 may select at least two among the plurality of voltage intervals. Within the at least two selected voltage intervals, the smallest number of memory cells may be included. The read voltage setting circuit 230 may select soft read voltages corresponding to the at least two selected voltage intervals as voltage candidates. The read voltage setting circuit 230 may set one of the voltage candidates as an optimal read voltage. The read voltage setting circuit 230 may set the optimal read voltage on the basis of a sum of numbers of memory cells within the at least two selected voltage intervals and neighboring voltage intervals.

The host 300 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Non-volatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
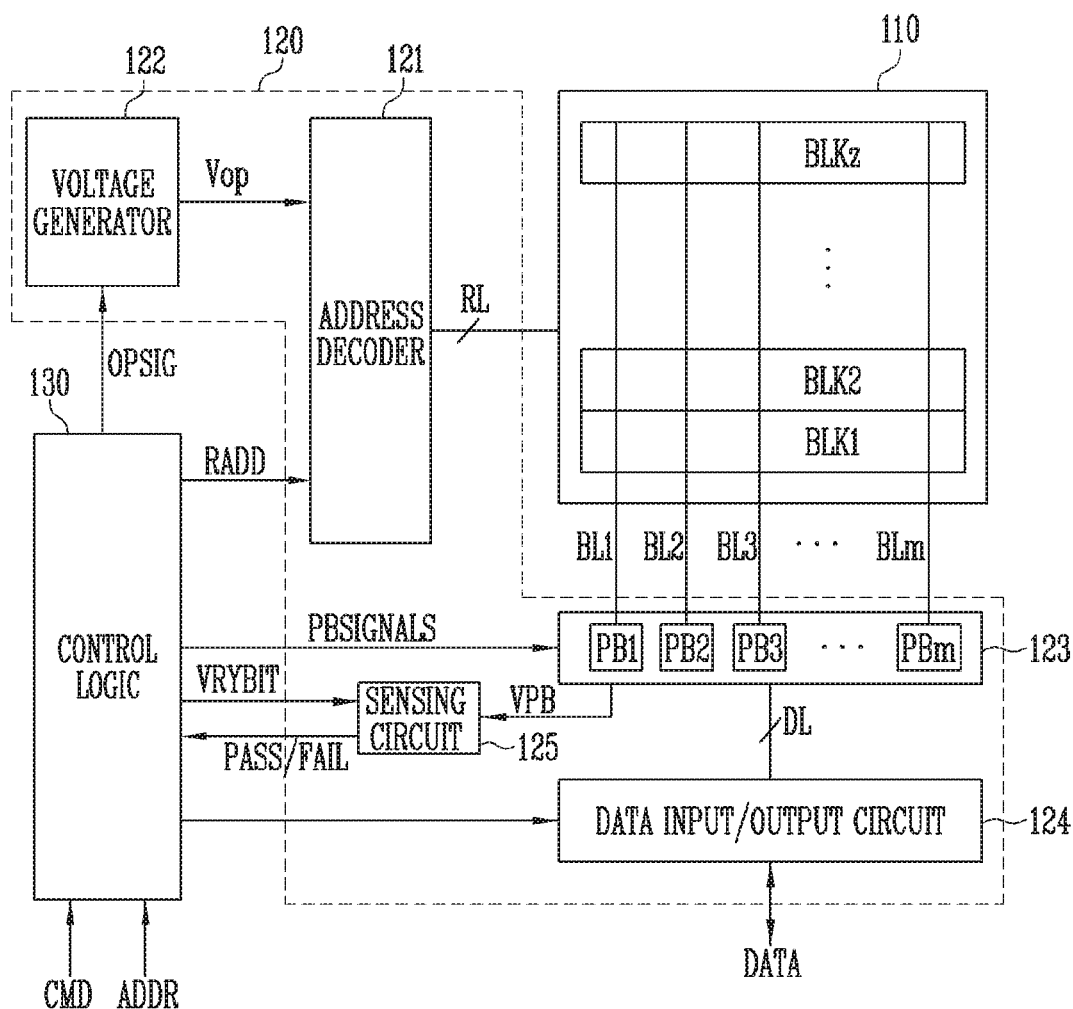
FIG. 2 is a diagram illustrating the structure of a memory device shown in FIG. 1.

FIG. 2 is a diagram illustrating the structure of the memory device 100 shown in FIG. 1.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be coupled to an address decoder 121 through row lines RL. The memory blocks BLK1 to BLKz may be coupled to a read and write circuit 123 through bit lines BL1 to BLm. Each of the plurality of memory blocks BLK1 to BLKz may include a plurality of memory cells. In an embodiment, the plurality of memory cells may be non-volatile memory cells. Memory cells coupled to the same word line, among the plurality of memory cells, may be defined as a single page. In other words, the memory cell array 110 may include a plurality of pages. In accordance with an embodiment, each of the plurality of memory blocks BLK1 to BLKz included in the memory cell array 110 may include a plurality of dummy cells. As the dummy cells, one or more dummy cells may be coupled in series between a drain select transistor and the memory cells and between a source select transistor and the memory cells.

The memory cells of the memory device 100 may include a single level cell (SLC) storing a single data bit, a multi level cell (MLC) storing two data bits, a triple level cell (TLC) storing three data bits, and a quad level cell (QLC) storing four data bits.

The peripheral circuit 120 may include an address decoder 121, a voltage generator 122, the read and write circuit 123, a data input/output circuit 124, and a sensing circuit 125.

The peripheral circuit 120 may drive the memory cell array 110. For example, the peripheral circuit 120 may drive the memory cell array 110 to perform a program operation, a read operation and an erase operation.

The address decoder 121 may be coupled to the memory cell array 110 through the row lines RL. The row lines RL may include drain select lines, word lines, source select lines, and a common source line. In accordance with an embodiment of the present disclosure, the word lines may include normal word lines and dummy word lines. In accordance with an embodiment, the row lines RL may further include a pipe selection line.

The address decoder 121 may be configured to operate in response to control of the control logic 130. The address decoder 121 may receive an address ADDR from the control logic 130.

The address decoder 121 may be configured to decode a block address of the received address ADDR. The address decoder 121 may select at least one memory block among the memory blocks BLK1 to BLKz according to the decoded block address. The address decoder 121 may be configured to decode a row address RADD of the received address ADDR. The address decoder 121 may select at least one word line WL of the selected memory block by applying voltages provided from the voltage generator 122 to the word line WL according to the decoded row address RADD.

During a program operation, the address decoder 121 may apply a program voltage to the selected word line and a pass voltage having a lower level than the program voltage to unselected word lines. During a program verify operation, the address decoder 121 may apply a verify voltage to the selected word line and a verify pass voltage greater than the verify voltage to the unselected word lines.

During a read operation, the address decoder 121 may apply a read voltage to the selected word line and a pass voltage having a lower level than the read voltage to unselected word lines.

In accordance with an embodiment of the present disclosure, the memory device 100 may perform an erase operation on each memory block. During the erase operation, the address ADDR input to the memory device 100 may include a block address. The address decoder 121 may decode the block address and select a single memory block in response to the decoded block address. During the erase operation, the address decoder 121 may apply a ground voltage to word lines input to the selected memory block.

In accordance with an embodiment, the address decoder 121 may be configured to decode a column address of the transferred address ADDR. The decoded column address may be transferred to the read and write circuit 123. For example, the address decoder 121 may include components such as a row decoder, a column decoder and an address buffer.

The voltage generator 122 may be configured to generate a plurality of operating voltages Vop by using an external power voltage supplied to the memory device 100. The voltage generator 122 may be controlled by the control logic 130.

In accordance with an embodiment, the voltage generator 122 may generate an internal power voltage by regulating an external power voltage. The internal power voltage generated by the voltage generator 122 may be used as an operating voltage for the memory device 100.

In accordance with an embodiment, the voltage generator 122 may generate the plurality of voltages Vop by using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selected read voltages, and a plurality of unselected read voltages.

The voltage generator 122 may include a plurality of pumping capacitors receiving the internal power voltage to generate the plurality of operating voltages Vop having various voltage levels, and may generate the plurality of operating voltages Vop by selectively activating the plurality of pumping capacitors in response to control of the control logic 130.

The plurality of operating voltages Vop may be supplied to the memory cell array 110 by the address decoder 121.

The read and write circuit 123 may include first to mth page buffers PB1 to PBm. The first to mth page buffers PB1 to PBm may be coupled to the memory cell array 110 through the first to mth bit lines BL1 to BLm, respectively. The first to mth page buffers PB1 to PBm may operate in response to the control of the control logic 130.

The first to mth page buffers PB1 to PBm may communicate data DATA with the data input/output circuit 124. During a program operation, the first to mth page buffers PB1 to PBm may receive the data DATA to be stored through the data input/output circuit 124 and data lines DL.

During a program operation, when a program pulse is applied to the selected word line, the first to mth page buffers PB1 to PBm may transfer the data DATA received through the data input/output circuit 124 to the selected memory cells through the bit lines BL1 to BLm. The memory cells of the selected page may be programmed according to the transferred data DATA. A memory cell coupled to a bit line to which a program permission voltage (e.g., a ground voltage) is applied may have an increased threshold voltage. A threshold voltage of a memory cell coupled to a bit line to which a program inhibition voltage (for example, a power voltage) is applied may be maintained. During a program verify operation, the first to mth page buffers PB1 to PBm may read the data DATA stored in the memory cells through the bit lines BL1 to BLm from the selected memory cells.

During a read operation, the read and write circuit 123 may read the data DATA through the bit lines BL1 to BLm from the memory cells of the selected page and may store the read data DATA in the first to mth page buffers PB1 to PBm.

During an erase operation, the read/write circuit 123 may float the bit lines BL1 to BLm. In accordance with an embodiment, the read and write circuit 123 may include a column selection circuit.

The data input/output circuit 124 is coupled to the first to mth page buffers PB1 to PBm through the data lines DL. The data input/output circuit 124 may operate in response to control of the control logic 130.

The data input/output circuit 124 may include a plurality of input/output buffers (not shown) receiving the input data DATA. During a program operation, the data input/output circuit 124 may receive the data DATA to be stored from an external controller (not shown). During a read operation, the data input/output circuit 124 may output the data DATA transferred from the first to mth page buffers PB1 to PBm included in the read and write circuit 123 to the external controller.

During a read operation or a verify operation, the sensing circuit 125 may generate a reference current in response to an allowable bit VRYBIT generated by the control logic 130 and may output a pass signal or a fail signal to the control logic 130 by comparing a sensing voltage VPB received from the read and write circuit 123 with a reference voltage generated by the reference current.

The control logic 130 may be coupled to the address decoder 121, the voltage generator 122, the read and write circuit 123, the data input/output circuit 124, and the sensing circuit 125. The control logic 130 may be configured to control the general operations of the memory device 100. The control logic 130 may operate in response to a command CMD transferred from an external device.

The control logic 130 may control the peripheral circuits 120 by generating various signals in response to the command CMD and the address ADDR. For example, the control logic 130 may output an operation signal OPSIG, the row address RADD, page buffer control signals PBSIGNALS, and the allowable bit VRYBIT in response to the command CMD and the address ADDR. The control logic 130 may output the operating signal OPSIG to the voltage generator 122, output the row address RADD to the address decoder 121, output a read and write control signal to the read and write circuit 123, and output the allowable bit VRYBIT to the sensing circuit 125. In addition, the control logic 130 may determine whether a verify operation passes or fails in response to the pass or fail signal (PASS/FAIL) output by the sensing circuit 125.

Figure 3:
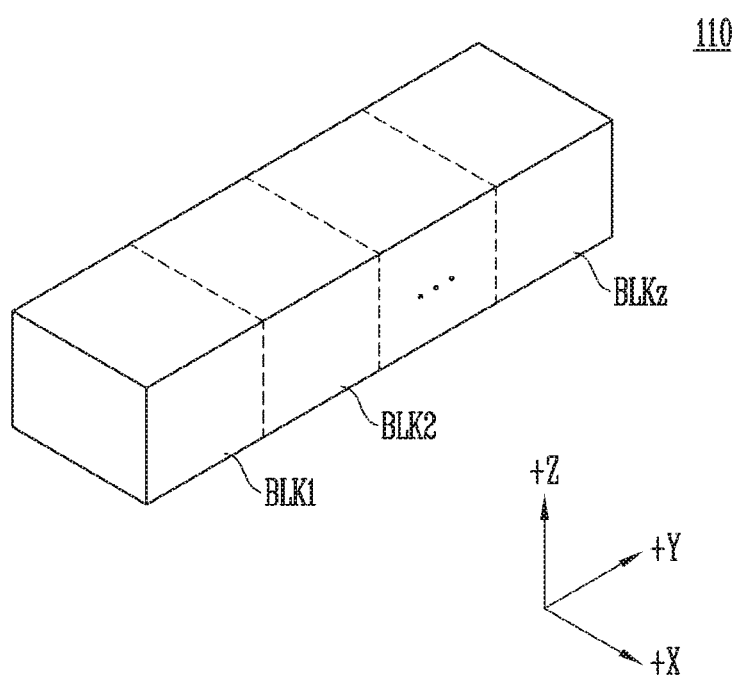
FIG. 3 is a diagram illustrating an embodiment of a memory cell array shown in FIG. 2.

FIG. 3 shows an embodiment of the memory cell array 110 shown in FIG. 2.

Referring to FIG. 3, the memory cell array 110 may include a plurality of memory blocks BLK1 to BLKz. Each memory block may have a three-dimensional structure. Each memory block may include a plurality of memory cells stacked over a substrate. The plurality of memory cells may be arranged in +X direction, +Y direction and +Z direction. The structure of each memory block will be described in detail below with reference to FIGS. 4 and 5.

Figure 4:
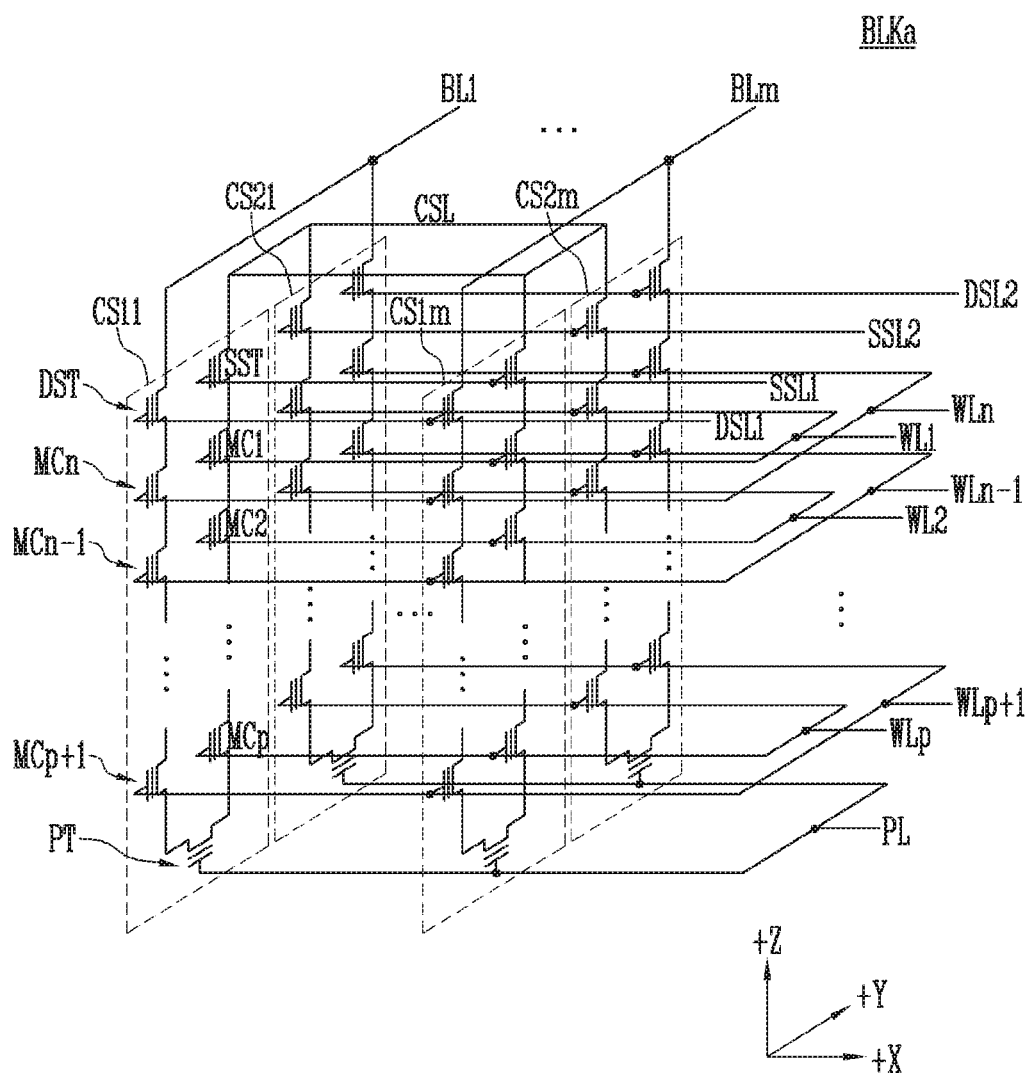
FIG. 4 is a circuit diagram illustrating a memory block which is one of the memory blocks shown in FIG. 3.

FIG. 4 is a circuit diagram illustrating one (BLKa) of the memory blocks BLK1 to BLKz shown in FIG. 3.

Figure 5:
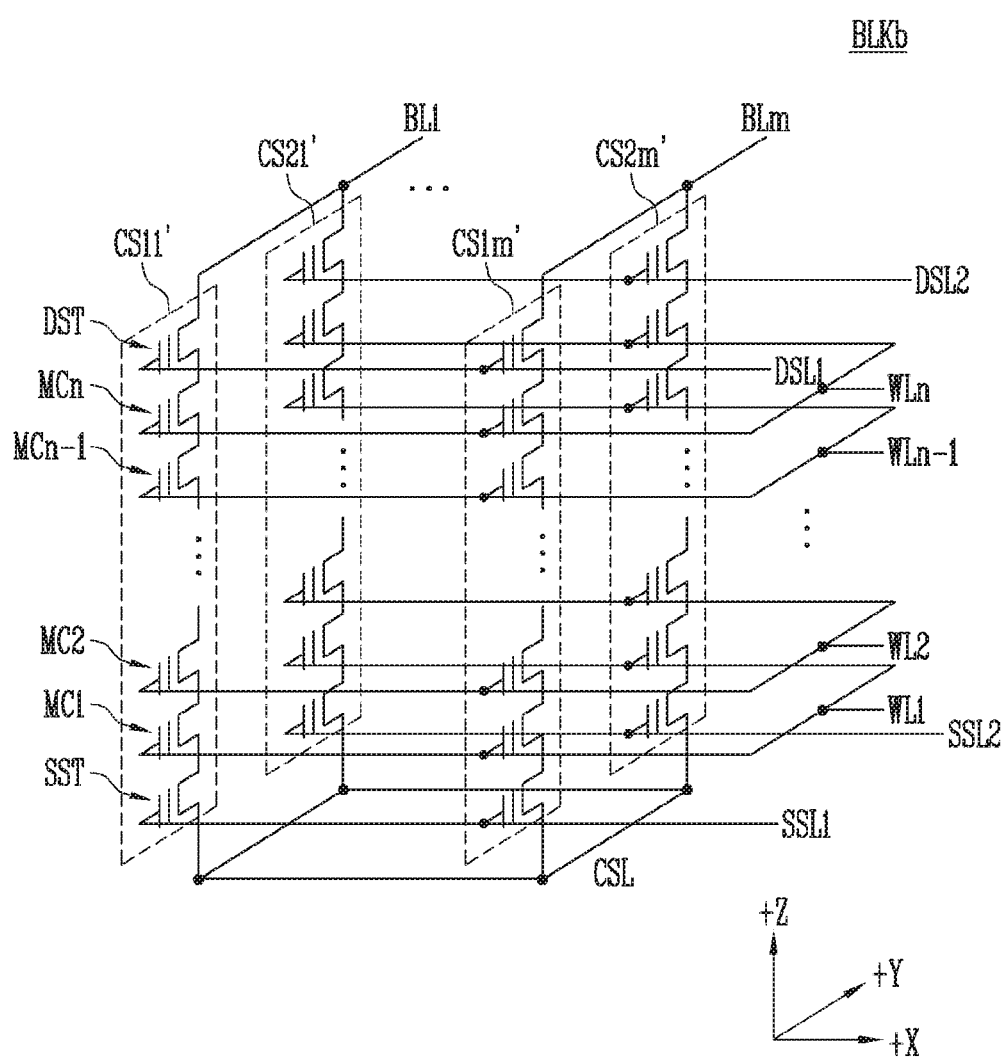
FIG. 5 is a circuit diagram illustrating another memory block which is one of the memory blocks shown in FIG. 3.

Referring to FIG. 4, the memory block BLKa may include a plurality of cell strings CS11 to CS1*m* and CS21 to CS2*m*. In accordance with an embodiment, each of the cell strings CS11 to CS1*m* and CS21 to CS2*m* may be formed in a U shape. In the memory block BLKa, 'm' cell strings may be arranged in a row direction (i.e., +X direction). FIG. 5 illustrates two cell strings arranged in a column direction (i.e., +Y direction). However, it is understood that three or more cell strings may be arranged in the column direction.

Each of the cell strings CS11 to CS1*m* and CS21 to CS2*m* may include at least one source select transistor SST, first to nth memory cells MC1 to MCn, a pipe transistor PT, and at least one drain select transistor DST.

Each of the select transistors SST and DST and each of the memory cells MC1 to MCn may have similar structures to each other. In accordance with an embodiment, each of the select transistors SST and DST and the memory cells MC1 to MCn may include a channel layer, a tunneling insulating layer, a charge storage layer, and a blocking insulating layer. In accordance with an embodiment, a pillar for providing a channel layer may be provided in each cell string. In accordance with an embodiment, a pillar for providing at least one of the channel layer, the tunneling insulating layer, the charge storage layer, and the blocking insulating layer may be provided to each cell string.

The source select transistor SST of each cell string may be coupled between a common source line CSL and memory cells MC1 to MCp.

In accordance with an embodiment, source select transistors of cell strings arranged in the same row may be coupled to a source select line extending in a row direction, and source select transistors of cell strings arranged in different rows may be coupled to different source select lines. In FIG. 4, source select transistors of the cell strings CS11 to CS1$m$ in the first row may be coupled to a first source select line SSL1. Source select transistors of the cell strings CS21 to CS2$m$ in the second row may be coupled to a second source select line 55L2.

In accordance with another embodiment, the source select transistors of the cell strings CS11 to CS1$m$ and CS21 to CS2$m$ may be coupled in common to one source select line.

The first to nth memory cells MC1 to MCn of each cell string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a reverse direction to the +Z direction and may be coupled in series between the source select transistor SST and the pipe transistor PT. The (p+1)th to nth memory cells MCp+1 to MCn may be sequentially arranged in the +Z direction and may be coupled in series between the pipe transistor PT and the drain selection transistor DST. The first to pth memory cells MC1 to MCp and the (p+1)th to nth memory cells MCp+1 to MCn may be coupled through the pipe transistor PT. Gates of the first to nth memory cells MC1 to MCn of each cell string may be coupled to first to nth word lines WL1 to WLn, respectively.

A gate of the pipe transistor PT of each cell string may be coupled to a pipe line PL.

The drain select transistor DST of each cell string may be coupled between a corresponding bit line and the memory cells MCp+1 to MCn. Cell strings arranged in the row direction may be coupled to a drain select line extending in the row direction. The drain select transistors of the cell strings CS11 to CS1$m$ in the first row are coupled to a first drain select line DSL1. Drain select transistors of the cell strings CS21 to CS2$m$ in the second row may be coupled to a second drain select line DSL2.

Cell strings arranged in the column direction may be coupled to a bit line extending in the column direction. In FIG. 4, the cell strings CS11 and CS21 in the first column may be coupled to the first bit line BL1. The cell strings CS1$m$ and CS2$m$ in an mth column may be coupled to the mth bit line BL$m$.

Memory cells coupled to the same word line arranged in cell strings arranged in the row direction may form a single page. For example, memory cells coupled to the first word line WL1 of the cell strings CS11 to CS1$m$ in the first row may constitute a single page. Memory cells coupled to the first word line WL1 of the cell strings CS21 to CS2$m$ in the second row may constitute another page. When one of the drain select lines DSL1 and DSL2 is selected, cell strings arranged in one row direction may be selected. When one of the first to nth word lines WL1 to WLn is selected, one page may be selected from the selected cell strings.

In accordance with another embodiment, even bit lines and odd bit lines may replace the first to mth bit lines BL1 to BL$m$. In addition, even cell strings of the cell strings CS11 to CS1$m$ or CS21 to CS2$m$ arranged in the row direction may be coupled to even bit lines, respectively, and odd cell strings of the cell strings CS11 to CS1$m$ or CS21 to CS2$m$ arranged in the row direction may be coupled to odd bit lines, respectively.

In accordance with an embodiment, at least one of the first to nth memory cells MC1 to MCn may serve as a dummy memory cell. For example, one or more dummy memory cells may be provided to reduce an electric field between the source select transistor SST and the memory cells MC1 to MCp. Alternatively, one or more dummy memory cells may be provided to reduce an electric field between the drain select transistor DST and the memory cells MCp+1 to MCn. When more dummy memory cells are provided, the operational reliability of the memory block BLKa may increase, whereas the size of the memory block BLKa may increase. On the other hand, when the number of dummy memory cells decreases, the size of the memory block BLKa may be reduced, and the operational reliability of the memory block BLKa may be reduced.

In order to efficiently control one or more dummy memory cells, each of the dummy memory cells may have a required threshold voltage. Before or after an erase operation on the memory block BLKa, program operations may be performed on a portion or entirety of the dummy memory cells. When an erase operation is performed after the program operations are performed, dummy memory cells may have required threshold voltages by controlling voltages applied to dummy word lines coupled to the respective dummy memory cells.

FIG. 5 is a circuit diagram illustrating another embodiment of a memory block BLKb which is one of the memory blocks BLK1 to BLKz shown in FIG. 3.

Referring to FIG. 5, the memory block BLKb may include a plurality of cell strings CS11' to CS1$m$' and CS21' to CS2$m$'. Each of the plurality of cell strings CS11' to CS1$m$' and CS21' to CS2$m$' may extend in the +Z direction. Each of the plurality of cell strings CS11' to CS1$m$' and CS21' to CS2$m$' may include at least one source select transistor SST, the first to nth memory cells MC1 to MCn, and at least one drain select transistor DST, which are stacked on a substrate (not shown) under a memory block BLK1'.

The source select transistor SST of each cell string may be coupled between a common source line CSL and memory cells MC1 to MCp. Source selection transistors of cell strings arranged in the same row may be coupled to the same source select line. Source select transistors of the cell strings CS11' to CS1$m$' arranged in the first row may be coupled to the first source select line SSL1. Source select transistors of the cell strings CS21' to CS2$m$' arranged in the second row may be coupled to the second source select line SSL2. In accordance with another embodiment, the source select transistors of the cell strings CS11' to CS1$m$ and CS21' to CS2$m$' may be commonly coupled to a single source select line.

The first to nth memory cells MC1 to MCn of each cell string may be coupled in series between the source select transistor SST and the drain select transistor DST. Gates of the first to nth memory cells MC1 to MCn of each cell string may be coupled to the first to nth word lines WL1 to WLn, respectively.

The drain select transistor DST of each cell string may be coupled between a corresponding bit line and the memory cells MCp+1 to MCn. Drain select transistors of cell strings arranged in a row direction may be coupled to a drain select line extending in the row direction. The drain select transistors of the cell strings CS11' to CS1m' in the first row may be coupled to the first drain select line DSL1. The drain select transistors of the cell strings CS21' to CS2m' in the second row may be coupled to the second drain select line DSL2.

As a result, the memory block BLKb shown in FIG. 5 may have a similar equivalent circuit to the memory block BLKa shown in FIG. 4 except that the pipe transistor PT is removed from each cell string of the memory block BLKb.

In accordance with another embodiment, even bit lines and odd bit lines may replace the first to mth bit lines BL1 to BLm. In addition, even cell strings of the cell strings CS11' to CS1m' or CS21' to CS2m' arranged in the row direction may be coupled to even bit lines, respectively, and odd cell strings of the cell strings CS11' to CS1m' or CS21' to CS2m' arranged in the row direction may be coupled to odd bit lines, respectively.

In accordance with an embodiment, at least one of the first to nth memory cells MC1 to MCn may serve as a dummy memory cell. For example, one or more dummy memory cells may be provided to reduce an electric field between the source select transistor SST and the first to nth memory cells MC1 to MCn. Alternatively, one or more dummy memory cells may be provided to reduce an electric field between the drain select transistor DST and the memory cells MC1 to MCn. When more dummy memory cells are provided, the operational reliability of the memory block BLKb may increase, whereas the size of the memory block BLKb may increase. When fewer dummy memory cells are provided, the size of the memory block BLKb may be reduced and the operational reliability of the memory block BLKb may be degraded.

In order to efficiently control one or more dummy memory cells, each of the dummy memory cells may have a required threshold voltage. Before or after an erase operation on the memory block BLKb, program operations may be performed on a portion or entirety of the dummy memory cells. When an erase operation is performed after the program operations are performed, dummy memory cells may have required threshold voltages by controlling voltages applied to dummy word lines coupled to the respective dummy memory cells.

Figure 6:
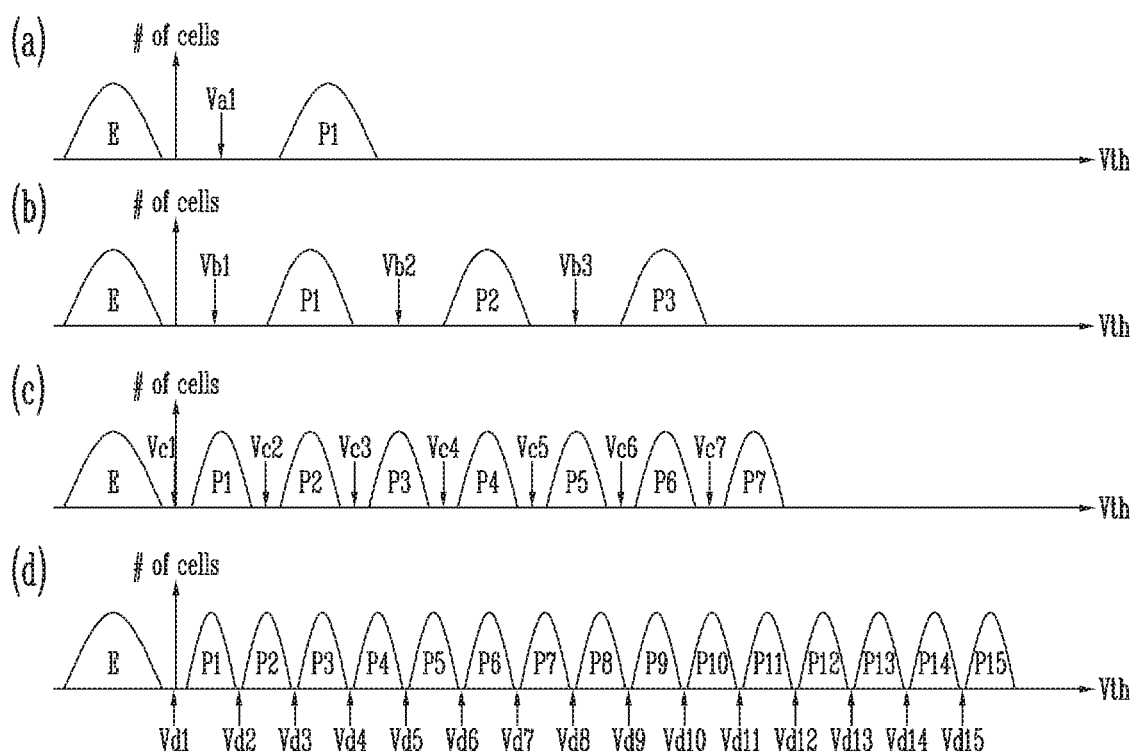
FIG. 6 is a diagram illustrating threshold voltage distributions of memory cells.

FIG. 6 is a diagram illustrating threshold voltage distributions of memory cells.

Referring to FIG. 6, a horizontal axis of each graph may represent the magnitude of a threshold voltage and a vertical axis may represent the number of memory cells.

Graphs (a) to (d) of FIG. 6 are described based on the assumption that a single memory cell stores one to four data bits. However, the number of data bits stored in a single memory cell may not be limited to embodiments of the present disclosure.

The graph (a) illustrates a threshold voltage distribution of a single-level cell (SLC) which stores a single data bit. The single-level cell (SLC) may have an erase state E or a program state P1.

A read voltage Va1 may be for identifying memory cells of the erase state E and the program state P1. A single level cell having the erase state E may be read as an on cell when the single level cell is read by the read voltage Va1. A single level cell having the program state P1 may be read as an off cell when the single level cell is read by the read voltage Va1.

The graph (b) may show a multi-level cell (MLC) in which a single memory cell stores two data bits. The multi-level cell (MLC) may have one of the erase state E and the first to third program states P1 to P3.

First to third read voltages Vb1 to Vb3 may be for identifying memory cells of the erase state E and the first to third program states P1 to P3. The first read voltage Vb1 may be for identifying memory cells of the erase state E and the program state P1. The second read voltage Vb2 may be for identifying memory cells of the first program state P1 and the second program state P2. The third read voltage Vb3 may be for identifying memory cells of the second program state P2 and the third program state P3.

The multi-level cell (MLC) may be classified into one of the erase state E and the first to third program states P1 to P3 according to a read result using each of the first to third read voltages Vb1 to Vb3.

The graph (c) may show a triple-level cell (TLC) which stores three data bits. The triple-level cell (TLC) may have one of the erase state E and the first to seventh program states P1 to P7.

First to seventh read voltages Vc1 to Vc7 may be for identifying memory cells of the erase state E and the first to seventh program states P1 to P7. The first read voltage Vc1 may be for identifying memory cells of the erase state E and the first program state P1. A second read voltage Vc2 may be for identifying memory cells of the first program state P1 and the second program state P2. In the same manner, the seventh read voltage Vc7 may be for identifying memory cells of a sixth program state P6 and the seventh program state P7.

The triple-level cell (TLC) may be classified into one of the erase state E and the first to seventh program states P1 to P7 according to a read result using each of the first to seventh read voltages Vc1 to Vc7.

The graph (d) may show a quad-level cell (QLC) in which stores four data bits. The quad-level cell (QLC) may have one of the erase state E and the first to fifteenth program states P1 to P15.

First to fifteenth read voltages Vd1 to Vd15 may be for identifying memory cells of the erase state E and the first to fifteenth program states P1 to P15. The first read voltage Vd1 may be for identifying memory cells of the erase state E and the first program state P1. A second read voltage Vd2 may be for identifying memory cells of the first program state P1 and the second program state P2. In the same manner, the fifteenth read voltage Vd15 may be for identifying memory cells of a fourteenth program state P14 and the fifteenth program state P15.

The quad-level cell (QLC) may be classified into one of the erase state E and the first to fifteenth program states P1 to P15 according to a read result using each of the first to fifteenth read voltages Vd1 to Vd15.

When the graphs (a) to (d) are compared against each other, as the number of data bits stored in a single memory cell increases, the number of program states which are shown by one memory cell and the number of read voltages for identifying memory cells of the program states may increase. When the number of program states which one memory cell may have increases, the width of the threshold voltage distribution corresponding to each program state may be reduced.

Figure 7:
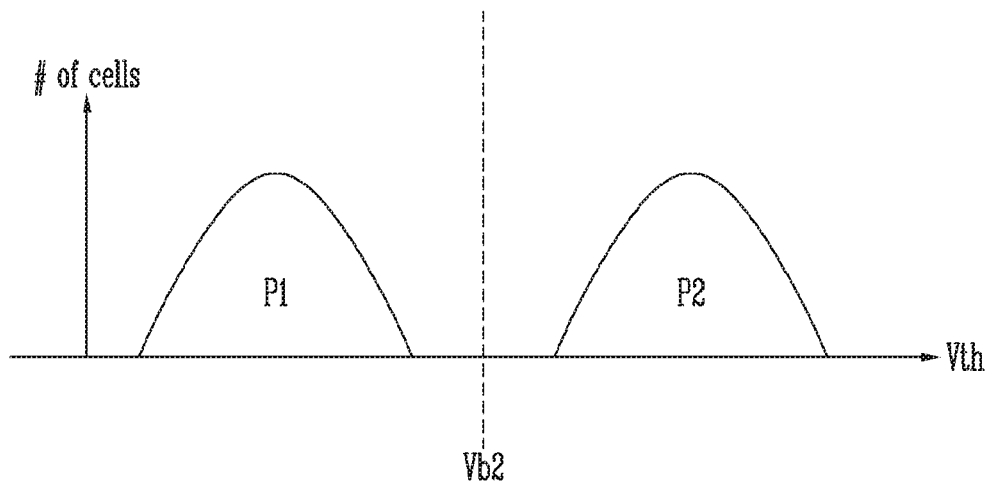
FIG. 7 is a diagram illustrating a read operation of memory cells.

FIG. 7 is a diagram illustrating a read operation on memory cells.

Referring to FIG. 7, during a read operation, memory cells may be read using a read voltage and the memory cells may be determined to have one of an erase state and a plurality of program states.

As shown in FIG. 7, the memory cells may have one of the first program state P1 and the second program state P2.

In accordance with an embodiment, the second read voltage Vb2 may be for identifying memory cells of the first program state P1 and the second program state P2. Memory cells programmed to have the first program state P1 may be read as on cells when the memory cells are read by the second read voltage Vb2. Memory cells programmed to have the second program state P2 may be read as off cells when the memory cells are read by the second read voltage Vb2. In other words, when the memory cells are read by the second read voltage Vb2, the memory cells may be classified as one of the first program state P1 and the second program state P2.

Figure 8A:
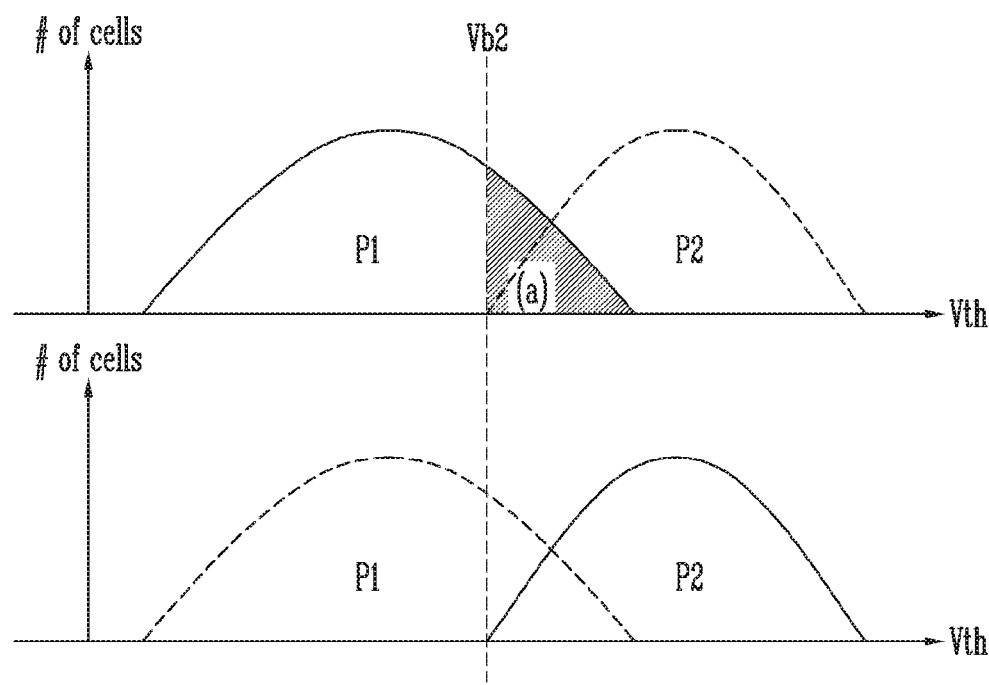
FIG. 8A is a diagram illustrating changes in threshold voltage distributions of memory cells caused by various factors such as deterioration of the memory cells, interference effects, and disturbance.

FIG. 8A is a diagram illustrating changes in threshold voltage distributions of memory cells caused by various factors such as deterioration of the memory cells, interference effects, and disturbance.

Referring to FIG. 8A, a threshold voltage distribution width corresponding to each of the first and second program states P1 and P2 may be greater than that of FIG. 7. When the threshold voltage distributions change, the threshold voltage distribution corresponding to the first program state P1 and the threshold voltage distribution corresponding to the second program state P2 may overlap each other.

Whether a read operation passes or fails may be determined depending on whether error correction decoding on data read using a read voltage passes or fails. The read operation may pass when the error correction decoding passes. The read operation may fail when the error correction decoding fails.

Whether error correction decoding passes or fails may be determined as a result of comparing the number of error bits included in data read using a read voltage with the number of correctable bits by the error correction decoder. The error correction decoding may pass when the number of error bits included in the read data is less than the number of correctable bits by the error correction decoder. The error correction decoding may fail when the number of error bits included in the read data exceeds the number of correctable bits by the error correction decoder.

The number of error bits may indicate the number of cells which are supposed to be read as on cells but are read as off cells, or the number of cells which are supposed to be read as off cells but are read as on cells. The number of correctable bits may indicate the number of error bits which can be recovered to the original bits by the error correction decoder.

In FIG. 8A, when memory cells having lower threshold voltages than the second read voltage Vb2, among the memory cells programmed to have the first program state P1, are read using the read voltage Vb2, these memory cells may be read as on cells.

An area (a) may include memory cells having greater threshold voltages than the second read voltage Vb2, among the memory cells programmed to have the first program state P1. Therefore, the memory cells included in the area (a) may be read as off cells when these memory cells are read using the second read voltage Vb2.

Therefore, when a read operation is performed to read the memory cells using the second read voltage Vb2, the number of error bits may be the number of memory cells included in the area (a). When the number of memory cells included in the area (a) exceeds the number of correctable bits by the error correction decoder, error correction decoding may fail. As a result, the read operation may fail. Alternatively, when the number of memory cells included in the area (a) is less than the number of correctable bits by the error correction decoder, the error correction decoding may pass. As a result, the read operation may pass.

Figure 8B:
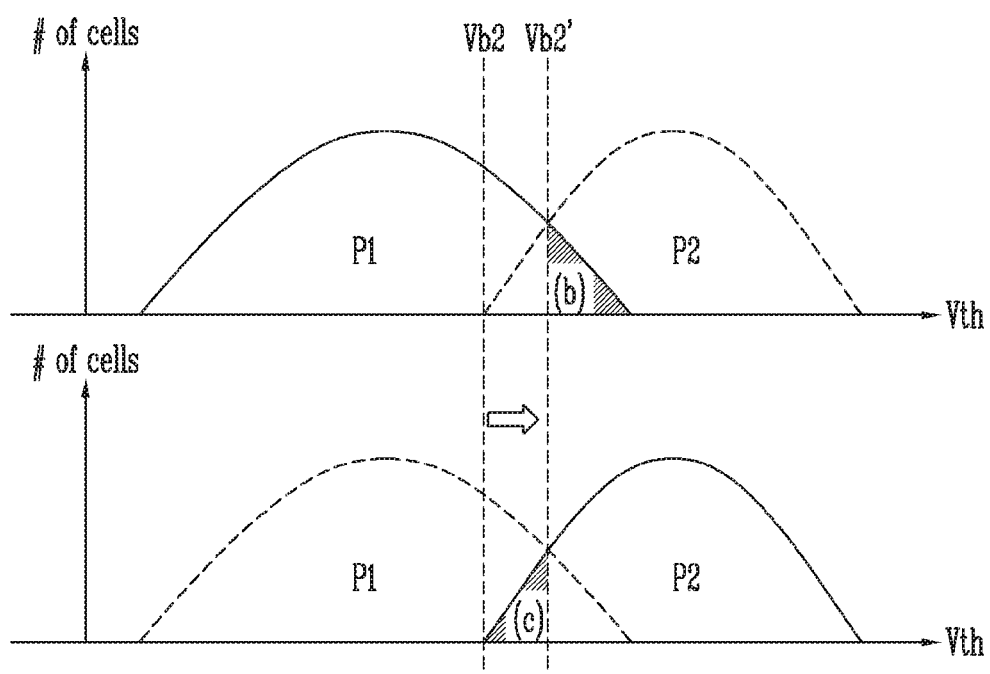
FIG. 8B is a diagram illustrating a change in number of error bits when a read voltage changes from a second read voltage Vb2 as shown in FIG. 8A to an optimal read voltage Vb2'.

FIG. 8B is a diagram illustrating a change in number of error bits when a read voltage changes from the second read voltage Vb2 as shown in FIG. 8A to an optimal read voltage Vb2'.

Referring to FIG. 8B, the optimal read voltage Vb2' may be located in an overlap between the first program state P1 and the second program state P2.

An area (b) may include memory cells having greater threshold voltages than the optimal read voltage Vb2', among the memory cells programmed to have the first program state P1. An area (c) may include memory cells having lower threshold voltages than the optimal read voltage Vb2', among the memory cells programmed to have the second program state P2. Therefore, in a read operation performed to read memory cells using the second read voltage Vb2, the number of error bits may be the sum of the number of memory cells included in the area (b) and the number of memory cells included in the area (c).

Since the read voltage changes from the second read voltage Vb2 to the optimal read voltage Vb2' when compared with FIG. 8A, the number of error bits may decrease from the number of memory cells included in the area (a) to the number of memory cells included in the areas (b)+(c). When the total number of error bits is reduced, the probability that error correction decoding passes may increase. Thus, the reliability of the read operation may be improved.

FIG. 9 is a flowchart illustrating operations of a storage device in accordance with an embodiment of the present disclosure.

Referring to FIG. 9, at step S901, the storage device may read memory cells included in a memory device using a default read voltage.

At step S903, the storage device may perform error correction decoding on data read by the default read voltage.

At step S905, the storage device may determine whether the error correction decoding passes or not. When a result of determination shows that the error correction decoding passes, an operation may be terminated. Otherwise, the process flow proceeds to step S907. The error correction decoding may pass when the number of error bits included in the read data using the default read voltage is less than the number of correctable bits by the error correction decoder.

At step S907, the storage device may read memory cells using a plurality of soft read voltages determined based on the default read voltage.

At step S909, the storage device may determine an optimal read voltage based on a result of reading the memory cells using the plurality of soft read voltages.

At step S911, the storage device may read the memory cells using the optimal read voltage.

At step S913, the storage device may perform error correction decoding on data read by the optimal read voltage.

At step S915, the storage device may determine whether the error correction decoding passes or not. When a result of determination shows that the error correction decoding passes, an operation may be terminated. Otherwise, the process flow proceeds to step S917. The error correction decoding may pass when the number of error bits included in the read data using the optimal read voltage is less than the number of correctable bits by the error correction decoder. When the error correction decoding passes, the data read using the optimal read voltage may be recovered to the original data, and the read operation may pass. When the error correction decoding fails, the data read using the optimal read voltage may not be recovered to the original data, and the read operation may fail.

At step S917, the storage device may execute another data recovery algorithm on the data read by the optimal read voltage.

Figure 10:
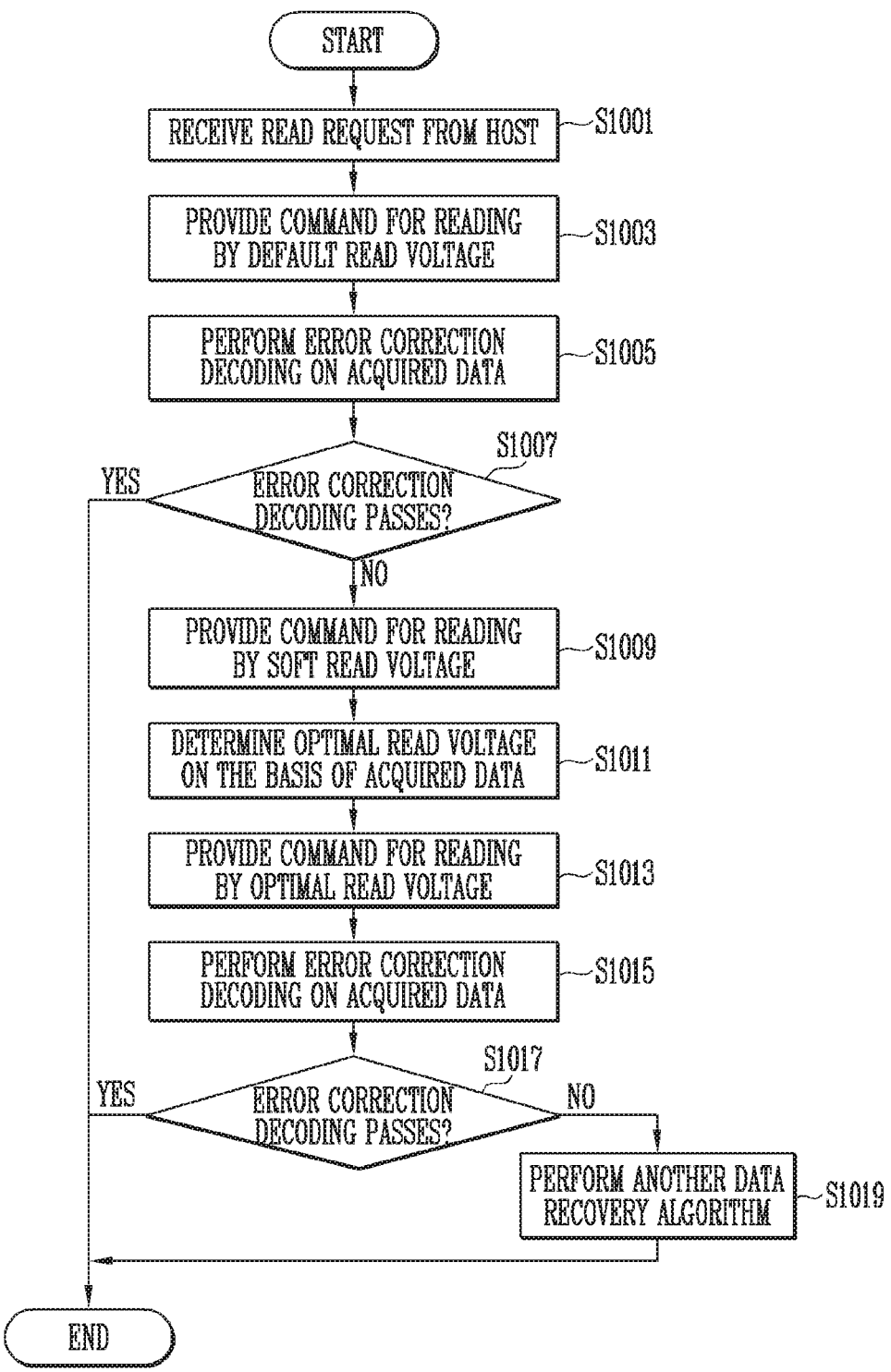
FIG. 10 is a flowchart illustrating operations of a memory controller in accordance with an embodiment of the present disclosure.

FIG. 10 is a flowchart illustrating operations of a memory controller in accordance with an embodiment.

Referring to FIG. 10, at step S1001, the memory controller may receive a read request for reading memory cells included in a memory device from a host.

At step S1003, the memory controller may provide the memory device with a command for reading a default read voltage to the memory device.

At step S1005, the memory controller may acquire data read using the default read voltage from the memory device and perform error correction decoding on the acquired data.

At step S1007, the memory controller may determine whether the error correction decoding passes or not. When the error correction decoding passes as a result of determination, an operation may be terminated. Otherwise, the process flow proceeds to step S1009. The error correction decoding may pass when the number of error bits included in the read data using the default read voltage is less than the number of correctable bits by an error correction decoder.

At step S1009, the memory controller may provide the memory device with a command for reading memory cells using a plurality of soft read voltages determined based on the default read voltage.

At step S1011, the memory controller may acquire data read using the plurality of soft read voltages from the memory device and determine an optimal read voltage based on the acquired data.

At step S1013, the memory controller may provide the memory device with a command for reading memory cells using the determined optimal read voltage.

At step S1015, the memory controller may acquire data read using the optimal read voltage from the memory device and perform error correction decoding on the acquired data.

At step S1017, the memory controller may determine whether the error correction decoding passes or not. When the error correction decoding passes as a result of determination, an operation may be terminated. Otherwise, the process flow proceeds to step S1019. The error correction decoding may pass when the number of error bits included in the read data using the optimal read voltage is less than the number of correctable bits by the error correction decoder. When the error correction decoding passes, the data read using the optimal read voltage may be recovered to the original data, and the read operation may pass. When the error correction decoding fails, the data read using the optimal read voltage may not be recovered to the original data, and the read operation may fail.

At step S1019, the memory controller may execute another data recovery algorithm on data acquired as a result of executing the command for reading the memory cells using the optimal read voltage.

Figure 11:
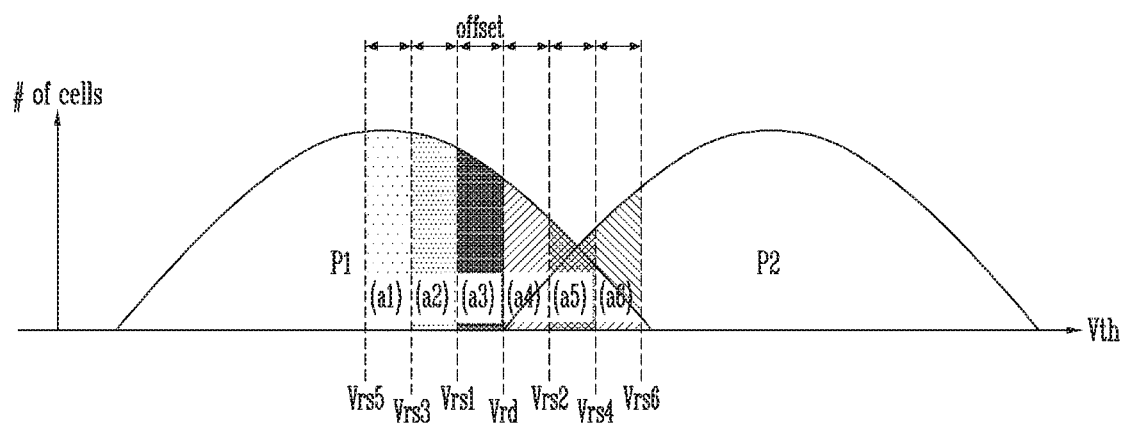
FIG. 11 is a diagram illustrating a soft read operation in accordance with an embodiment of the present disclosure.

FIG. 11 is a diagram illustrating a soft read operation in accordance with an embodiment.

Referring to FIG. 11, the soft read operation may be performed to read memory cells using a plurality of soft read voltages determined based on a default read voltage used in a failed read operation. The plurality of soft read voltages may define a plurality of voltage intervals. Through the soft read operation, the number of memory cells having threshold voltage belonging to each of the plurality of voltage intervals may be counted.

However, the number of program states memory cells have, the number of default read voltages for identifying memory cells of the program states, and the number of soft read voltages determined based on a default read voltage may not be limited to this embodiment.

As shown in FIG. 11, each of the memory cells may have one of the first program state P1 and the second program state P2. A default read voltage Vrd may be for identifying memory cells of the first program state P1 and the second program state P2. First to sixth soft read voltages Vrs1 to Vrs6 may be determined based on the default read voltage Vrd.

The soft read voltages may be arranged at uniform voltage intervals. For example, each of the first to sixth soft read voltages Vrs1 to Vrs6 may be spaced apart from a neighboring soft read voltage at a uniform voltage interval. In another embodiment, the soft read voltage may be arranged at different voltage intervals.

The first to sixth soft read voltages Vrs1 to Vrs6 may have different offsets with reference to the default read voltage Vrd. The second, fourth, and sixth soft read voltages Vrs2, Vrs4, and Vrs6 having a higher level than the default read voltage Vrd may have different positive offsets. First, third, and fifth soft read voltages Vrs1, Vrs3, and Vrs5 having a lower level than the default read voltage Vrd may have different negative offsets. Each of the soft read voltages may have a predetermined offset value with reference to the default read voltage Vrd.

When a read operation to read memory cells using the default read voltage Vrd fails, a soft read operation for reading the memory cells using the first to sixth soft read voltages Vrs1 to Vrs6 determined based on the default read voltage Vrd may be performed.

First to sixth voltage intervals a1 to a6 may be defined by the default read voltage Vrd and the first to sixth soft read voltages Vrs1 to Vrs6. In accordance with an embodiment, a read voltage corresponding to each voltage interval may be a minimum voltage of each voltage interval. In accordance with another embodiment, a read voltage corresponding to each voltage interval may be an intermediate voltage of each voltage interval. In accordance with another embodiment, a read voltage corresponding to each voltage interval may be an average voltage of each voltage interval. In accordance with another embodiment, a read voltage corresponding to each voltage interval may be a maximum voltage of each voltage interval.

In FIG. 11, a read voltage corresponding to each voltage interval may be a minimum voltage of each voltage interval. For example, a read voltage corresponding to the first voltage interval a1 may be the fifth soft read voltage Vrs5. A read voltage corresponding to a second voltage interval a2 may be the third soft read voltage Vrs3. A read voltage corresponding to a third voltage interval a3 may be the first soft read voltage Vrs1. A read voltage corresponding to a fourth voltage interval a4 may be the default read voltage Vrd. A read voltage corresponding to a fifth voltage interval a5 may be the second soft read voltage Vrs2. A read voltage corresponding to the sixth voltage interval a6 may be a fourth soft read voltage Vrs4.

In FIG. 11, the number of memory cells having threshold voltages belonging to each of the first to sixth voltage intervals a1 to a6 may be counted.

The first voltage interval a1 may include memory cells having threshold voltages greater than the fifth soft read voltage Vrs5 and less than the third soft read voltage Vrs3, among the memory cells having the first program state P1.

The second voltage interval a2 may include memory cells having threshold voltages greater than the third soft read voltage Vrs3 and less than the first soft read voltage Vrs1, among the memory cells having the first program state P1.

The third voltage interval a3 may include memory cells having threshold voltages greater than the first soft read voltage Vrs1 and less than the default read voltage Vrd, among the memory cells having the first program state P1.

The fourth voltage interval a4 may include memory cells having threshold voltages greater than the default read voltage Vrd and less than the second soft read voltage Vrs2, among the memory cells having the first program state P1, and memory cells having threshold voltages greater than the default read voltage Vrd and less than the second soft read voltage Vrs2, among the memory cells having the second program state P2.

The fifth voltage interval a5 may include memory cells having threshold voltages greater than the second soft read voltage Vrs2 and less than the fourth soft read voltage Vrs4, among the memory cells having the first program state P1, and memory cells having threshold voltages greater than the second soft read voltage Vrs2 and less than the fourth soft read voltage Vrs4, among the memory cells having the second program state P2.

The sixth voltage interval a6 may include memory cells having threshold voltages greater than the fourth soft read voltage Vrs4 and less than the sixth soft read voltage Vrs6, among the memory cells having the first program state P1, and memory cells having threshold voltages greater than the fourth soft read voltage Vrs4 and less than the sixth soft read voltage Vrs6, among the memory cells having the second program state P2.

At least two voltage intervals may be selected as voltage interval candidates in ascending order of the number of memory cells corresponding to each voltage interval. Among the selected voltage interval candidates, a voltage interval candidate having a smallest sum of numbers of memory cells included in adjacent voltage intervals to each voltage interval candidate may be selected as an optimal voltage interval. A read voltage corresponding to the optimal voltage interval may be determined as an optimal read voltage.

For example, the fourth to sixth voltage intervals a4 to a6 may be selected as voltage interval candidates in ascending order of the number of memory cells included in each voltage interval. The fifth voltage interval a5 having a smallest sum of numbers of memory cells included in adjacent voltage intervals (i.e., the fourth and sixth voltage intervals a4 and a6) thereto may be selected as an optimal voltage interval. Therefore, the second soft read voltage Vrs2 corresponding to the fifth voltage interval a5 may be determined as an optimal read voltage.

In accordance with another embodiment, a soft read operation relating to some of a plurality of soft read voltages may be performed in advance during another data recovery algorithm execution process. Data read by some of the soft read voltages previously performed and stored may be utilized as data for determining an optimal read voltage.

For example, when a read operation fails, a soft read operation for reading memory cells by the fifth soft read voltage Vrs5 and the sixth soft read voltage Vrs6 may be performed in advance through another data recovery algorithm. Data read by the fifth soft read voltage Vrs5 and the sixth soft read voltage Vrs6 previously performed and stored may be utilized as data for determining an optimal read voltage. Therefore, in accordance with an embodiment, an optimal read voltage may be determined with only a result of performing the soft read operation relating to the first to fourth read voltages Vrs1 to Vrs4.

Figure 12:
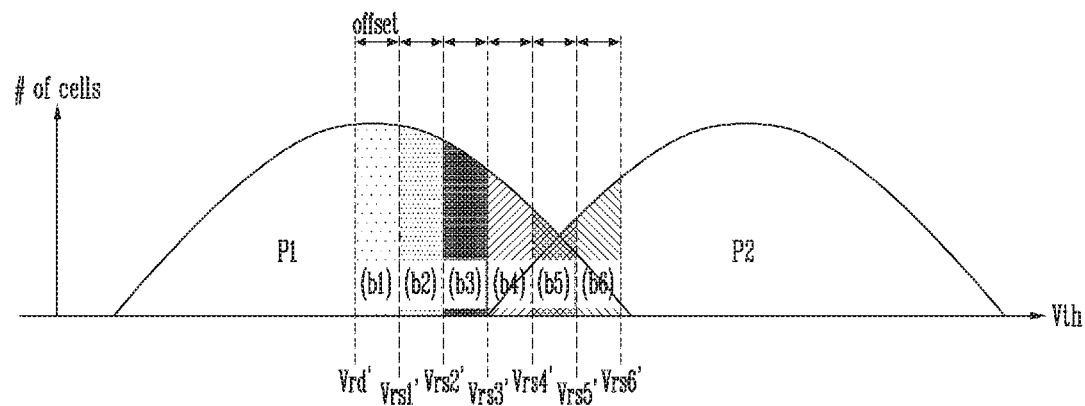
FIG. 12 is a diagram illustrating a soft read operation in accordance with an embodiment of the present disclosure.

FIG. 12 is a diagram illustrating a soft read operation in accordance with another embodiment.

Referring to FIG. 12, when compared against the soft read operation described above with reference to FIG. 11, a plurality of soft read voltages may sequentially increase at uniform voltage intervals on the basis of a default read voltage. In accordance with another embodiment, a plurality of soft read voltages may sequentially decrease at uniform voltage intervals on the basis of a default read voltage.

For example, first to sixth soft read voltages Vrs1' to Vrs6' may sequentially increase at uniform offset voltage intervals (Offset) on the basis of a default read voltage Vrd'. The default read voltage Vrd' may be for identifying memory cells of the first program state P1 and the second program state P2. The first to sixth soft read voltages Vrs1' to Vrs6' may be determined based on the default read voltage Vrd'. Each of the first to sixth soft read voltages Vrs1' to Vrs6' may be spaced apart from a neighboring soft read voltage at a predetermined offset voltage interval (Offset).

First to sixth voltage intervals b1 to b6 may be defined by the default read voltage Vrd' and the first to sixth soft read voltages Vrs1' to Vrs6'. In accordance with an embodiment, a read voltage corresponding to each voltage interval may be a minimum voltage of each voltage interval. In accordance with another embodiment, a read voltage corresponding to each voltage interval may be an intermediate voltage of each voltage interval. In accordance with another embodiment, a read voltage corresponding to each voltage interval may be an average voltage of each voltage interval. In accordance with another embodiment, a read voltage corresponding to each voltage interval may be a maximum voltage of each voltage interval.

In FIG. 12, a read voltage corresponding to each voltage interval may be a minimum voltage of each voltage interval. For example, a read voltage corresponding to the first voltage interval b1 may be the default read voltage Vrd'. A read voltage corresponding to a second voltage interval b2 may be the first soft read voltage Vrs1'. A read voltage corresponding to a third voltage interval b3 may be a second soft read voltage Vrs2'. A read voltage corresponding to a fourth voltage interval b4 may be a third soft read voltage Vrs3'. A read voltage corresponding to a fifth voltage interval b5 may be a fourth soft read voltage Vrs4'. A read voltage corresponding to the sixth voltage interval b6 may be a fifth soft read voltage Vrs5'.

In FIG. 12, the number of memory cells having threshold voltages belonging to each of the first to sixth voltage intervals b1 to b6 may be counted.

The first voltage interval b1 may include memory cells having threshold voltages greater than the default read voltage Vrd' and less than the first soft read voltage Vrs1', among the memory cells having the first program state P1.

The second voltage interval b2 may include memory cells having threshold voltages greater than the first soft read voltage Vrs1' and less than the second soft read voltage Vrs2', among the memory cells having the first program state P1.

The third voltage interval b3 may include memory cells having threshold voltages greater than the second soft read voltage Vrs2' and less than the third soft read voltage Vrs3', among the memory cells having the first program state P1, and memory cells having threshold voltages greater than the second soft read voltage Vrs2' and less than the third soft read voltage Vrs3', among the memory cells having the second program state P2.

The fourth voltage interval b4 may include memory cells having threshold voltages greater than the third soft read voltage Vrs3' and less than the fourth soft read voltage Vrs4', among the memory cells having the first program state P1, and memory cells having threshold voltages greater than the third soft read voltage Vrs3' and less than the fourth soft read voltage Vrs4', among the memory cells having the second program state P2.

The fifth voltage interval b5 may include memory cells having threshold voltages greater than the fourth soft read voltage Vrs4' and less than the fifth soft read voltage Vrs5', among the memory cells having the first program state P1, and memory cells having threshold voltages greater than the fourth soft read voltage Vrs4' and less than the fifth soft read voltage Vrs5', among the memory cells having the second program state P2.

The sixth voltage interval b6 may include memory cells having threshold voltages greater than the fifth soft read voltage Vrs5' and less than the sixth soft read voltage Vrs6', among the memory cells having the first program state P1, and memory cells having threshold voltages greater than the fifth soft read voltage Vrs5' and less than the sixth soft read voltage Vrs6', among the memory cells having the second program state P2.

In accordance with an embodiment, the fourth voltage interval b4 and the fifth voltage interval b5 may be selected as voltage interval candidates in ascending order of the number of memory cells corresponding to each voltage interval. The fifth voltage interval b5 having a smallest sum of numbers of memory cells included in adjacent voltage intervals (i.e., the fourth and sixth voltage intervals b4 and b6) thereto may be selected as an optimal voltage interval. Therefore, the fourth soft read voltage Vrs4' corresponding to the fifth voltage interval b5 may be determined as an optimal read voltage.

Figure 13:
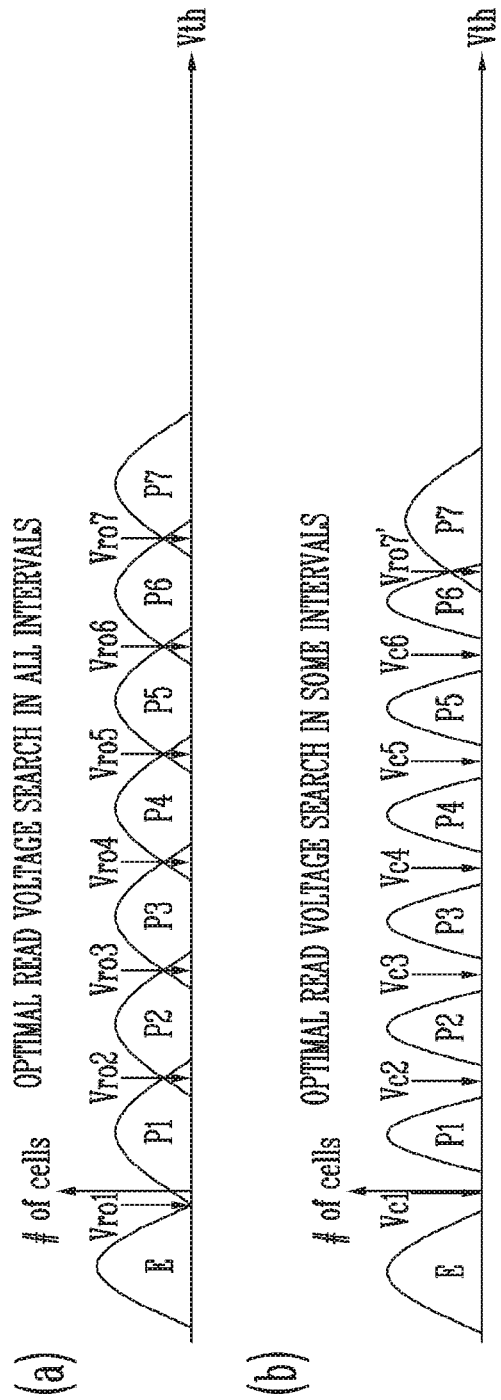
FIG. 13 is a diagram illustrating an interval during which an optimal read voltage search operation is performed.

FIG. 13 is a diagram illustrating a voltage interval during which an optimal read voltage search operation is performed.

Referring to FIG. 13, each of the memory cells may be a triple-level cell having one of the erase state E and first to seventh program states P1 to P7. An optimal read voltage search may be performed between two adjacent threshold voltage distributions.

In accordance with an embodiment, the optimal read voltage search may be performed within voltage intervals between all threshold voltage distributions.

Referring to a graph (a), an optimal read voltage search may be performed within each of the voltage intervals between the threshold voltage distributions corresponding to the erase state E and the first to seventh program states P7. Therefore, a search for first to seventh optimal read voltages Vr01 to Vro7 may be performed. The first optimal read voltage Vr01 may be for identifying memory cells of the erase state E and the first program state P1. A second optimal read voltage Vro2 may be for identifying memory cells of the first program state P1 and the second program state P2. In the same manner, the seventh optimal read voltage Vro7 may be for identifying memory cells of the sixth program state P6 and the seventh program state P7.

In accordance with another embodiment, an optimal read voltage search may be performed within voltage intervals between some threshold voltage distributions. Some threshold voltage distributions may have greater threshold voltages than other threshold voltage distributions. Threshold voltage distributions having greater threshold voltages may have greater threshold voltage distribution widths than threshold voltage distributions having lower threshold voltages since they are vulnerable to deterioration of memory cells, interference effects between the memory cells, program disturbance, or read disturbance.

Referring to a graph (b), an optimal read voltage search may be performed only within a voltage interval between threshold voltage distributions corresponding to the sixth program state P6 and the seventh program state P7, among the erase state E and all program states P1 to P7. Therefore, a search for a seventh optimal read voltage Vro7' may be performed within the voltage interval of the threshold voltage distributions corresponding to the sixth program state P6 and the seventh program state P7.

FIG. 14 is a diagram illustrating data for setting an optimal read voltage.

Referring to FIG. 14, data for setting an optimal read voltage may be described on the basis of the soft read operation described above with reference to FIG. 12. A default read voltage not shown on the table in FIG. 14 corresponds to the default read voltage Vrd' in FIG. 12. Each of first to sixth soft read voltages Vrs1 to Vrs6 in FIG. 14 corresponds to each of the first to sixth soft read voltages Vrs1' to Vrs6' in FIG. 12. Each of first to fifth voltage intervals in FIG. 14 corresponds to each of the second to sixth voltage intervals b2 to b6.

Memory cells may be programmed to have at least one of an erase state and a plurality of program states. A default read voltage may be for identifying memory cells of two adjacent states among the erase state and the plurality of program states. A plurality of soft read voltages may be determined based on the default read voltage used during the failed read operation.

In FIG. 14, when the read operation fails with the default read voltage, the first to sixth soft read voltages Vrs1 to Vrs6 may be determined based on the default read voltage. However, the number of soft read voltages determined based on the default read voltage may not be limited to this embodiment.

The first to sixth soft read voltages Vrs1 to Vrs6 may be sequentially increased at uniform voltage intervals based on the default read voltage. First to fifth voltage intervals may be defined by the first to sixth soft read voltages Vrs1 to Vrs6.

In FIG. 14, a read voltage corresponding to each voltage interval may be a minimum voltage of each voltage interval. The first soft read voltage Vrs1 may have a median value of a lower P1 between the two threshold voltage distributions P1 and P2 to which the read operation fails with the default read voltage. The sixth soft read voltage Vrs6 may have a median value of a higher P2 between the two threshold voltage distributions P1 and P2 to which the read operation fails with the default read voltage. Therefore, the first soft read voltage Vrs1 and the sixth soft read voltage Vrs6, among all soft read voltages, may be excluded from voltage candidates for determining an optimal read voltage.

Detection data corresponding to a read voltage may be the number of data having a predetermined logic value among data read by the read voltage. The predetermined logic value may be one of '1' and '0'.

For example, first detection data d1 may be the number of data having a predetermined logic value among data read by the first soft read voltage Vrs1. Second detection data d2 may be the number of data having a predetermined logic value among data read by the second soft read voltage Vrs2.

In the same manner, sixth detection data d6 may be the number of data having a predetermined logic value among data read by the sixth soft read voltage Vrs6.

Voltage interval data in each voltage interval may have an absolute value obtained by subtracting detection data corresponding to each of two adjacent soft read voltages from each other.

In FIG. 14, first voltage interval data bin1 may have an absolute value obtained by subtracting the first detection data d1 corresponding to the first soft read voltage Vrs1 from the second detection data d2 corresponding to the second soft read voltage Vrs2. Second voltage interval data bin2 may have an absolute value obtained by subtracting the second detection data d2 from third detection data d3. In the same manner, fifth voltage interval data bin5 may have an absolute value obtained by subtracting fifth detection data d5 from the sixth detection data d6.

A sum of adjacent voltage interval data of each voltage interval may show a sum of voltage interval data of adjacent voltage intervals with reference to the voltage interval.

For example, the second voltage interval may correspond to the second soft read voltage Vrs2. Therefore, the sum of adjacent voltage interval data corresponding to the second soft read voltage Vrs2 may be (bin1+bin3), i.e., the sum of the first and third voltage interval data bin1 and bin3 of the first and third voltage intervals located at both sides of the second voltage interval. The sum of adjacent voltage interval data corresponding to the third soft read voltage Vrs3 may be (bin2+bin4), i.e., the sum of the second and fourth voltage interval data bin2 and bin4 of the second and fourth voltage intervals located at both sides of the third voltage interval. The sum of adjacent voltage interval data corresponding to the fourth soft read voltage Vrs4 may be (bin3+bin5), i.e., the sum of the third and fifth voltage interval data bin3 and bin5 of the third and fifth voltage intervals located at both sides of the fourth voltage interval.

FIG. 15 is a diagram illustrating an optimal read voltage setting method in accordance with an embodiment of the present disclosure.

Referring to FIG. 15, first to fifth voltage intervals may be determined according to the first to sixth soft read voltages Vrs1 to Vrs6.

In accordance with an embodiment, a soft read voltage corresponding to a voltage interval with smallest voltage interval data may be determined as an optimal read voltage. Therefore, the fourth soft read voltage Vrs4 corresponding to the fourth voltage interval having a voltage interval data of 3, among the first to sixth soft read voltages Vrs1 to Vrs6, may be determined as an optimal read voltage.

FIG. 16 is a diagram illustrating a case in which an optimal read voltage is set.

Referring to FIG. 16, it is shown that an error occurs in detection data corresponding to the second soft read voltage Vrs2. When the number of logic values of data read by a soft read voltage is wrongly counted, an error may occur in detection data.

In the actual case of FIG. 15, there may occur an error while reading data according to the second soft read voltage Vrs2 and thus the detection data corresponding to the second soft read voltage Vrs2 may erroneously have a value of 130, which is supposed to be 116, as illustrated in FIG. 16. An error may also occur in the voltage interval data of the second voltage interval. The voltage interval data of the second voltage interval may erroneously have a value of 0, which is supposed to be 14, as illustrated in FIGS. 15 and 16.

Under these circumstances, the optimal read voltage may be wrongly set. For example, instead of the fourth soft read voltage Vrs4 correctly set as the optimal read voltage as shown in FIG. 15, the second soft read voltage Vrs2 corresponding to the second voltage interval erroneously having the smallest voltage interval data of 0 may be wrongly set as the optimal read voltage, as illustrated in FIG. 16.

FIG. 17 is a diagram illustrating an optimal read voltage setting method in accordance with another embodiment of the present disclosure.

Referring to FIG. 17, even when an error occurs while reading data according to the soft read voltages, the optimal read voltage may be correctly set.

In accordance with another embodiment, at least two soft read voltages may be selected as voltage candidates in ascending order from smallest voltage interval data. Among the selected voltage candidates, a voltage candidate having a smallest sum of adjacent voltage interval data may be selected as an optimal read voltage. The sum of adjacent voltage interval data may be the sum of voltage interval data corresponding to soft read voltages adjacent to each of the voltage candidates.

In FIG. 17, the second soft read voltage Vrs2 having a voltage interval data of 0 and the fourth soft read voltage Vrs4 having a voltage interval data of 3 may be selected as voltage candidates in ascending order from smallest voltage interval data. The fourth soft read voltage Vrs4 whose adjacent voltage interval data have a sum of 12, among the voltage candidates, may be selected as an optimal read voltage.

In accordance with this embodiment, the fourth soft read voltage Vrs4, not the second soft read voltage Vrs2, may be correctly selected as the optimal read voltage, when compared with FIG. 16.

Figure 18:
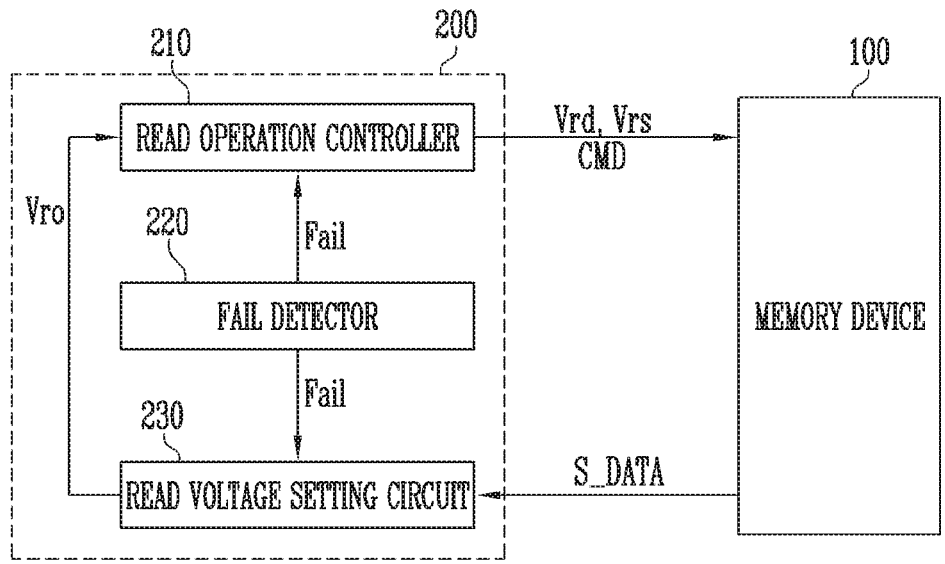
FIG. 18 is a diagram illustrating operations of a memory controller in accordance with an embodiment of the present disclosure.

FIG. 18 is a diagram illustrating operations of the memory controller 200 in accordance with an embodiment of the present disclosure.

As described above with reference to FIG. 1, the memory controller 200 may include the read operation controller 210, the fail detector 220 and the read voltage setting unit 230. The read operation controller 210, the fail detector 220 and the read voltage setting circuit 230 include all circuits, systems, software, firmware, and devices necessary for their respective functions.

The read operation controller 210 may control a read operation for reading memory cells by the default read voltages Vrd. The default read voltages Vrd may be predetermined voltages for identifying the memory cells programmed into one of an erase state and a plurality of program states. The memory controller 200 may perform error correction decoding to correct errors in data read using the default read voltages Vrd.

When the error correction decoding passes, original data may be recovered and the read operation may pass. When the error correction decoding fails, the original data may not be recovered and the read operation may fail.

The read operation controller 210 may perform a read operation again by an optimal read voltage having a different voltage level from the default read voltage Vrd when the read operation fails according to the default read voltage Vrd. In accordance with an embodiment, to determine an optimal read voltage, the read operation controller 210 may control a soft read operation to read the memory cells using a plurality of soft read voltages. The plurality of soft read voltages may be determined based on the default read voltage used during the failed read operation. Error correction decoding may not be performed on data read using the soft read voltages.

The read operation controller 210 may control an operation of reading the memory cells by the optimal read voltage determined as a result of performing the soft read operation. Error correction decoding may be performed on data read using the optimal read voltage. When the error correction decoding passes, the data read using the optimal read voltage may be recovered to the original data, and the read operation may pass. When the error correction decoding fails, the data read using the optimal read voltage may not be recovered to the original data, and the read operation may fail.

The read operation controller 210 may provide the memory device 100 with the read command CMD for reading the memory cells by the default read voltage Vrd, the soft read voltages Vrs and the optimal read voltage.

The fail detector 220 may detect a failure of the read operation. More specifically, the fail detector 220 may detect the failure of the read operation when the error correction decoding on the data read using the default read voltage fails.

When the read operation fails, the fail detector 220 may generate a fail signal and provide the generated fail signal to the read operation controller 210 and the read voltage setting unit 230. More specifically, the fail detector 220 may generate the fail signal when error correction decoding on a result of performing the read operation by the error correction decoder fails.

The read voltage setting circuit 230 may acquire soft read data S_DATA obtained by reading the memory cells using the plurality of soft read voltages Vrs. The read voltage setting circuit 230 may determine an optimal read voltage Vro using the acquired soft read data S_DATA. More specifically, the read voltage setting circuit 230 may determine the optimal read voltage Vro on the basis of the soft read data S_DATA in response to the fail signal provided from the fail detector 220.

The read voltage setting circuit 230 may generate detection data according to each of the plurality of soft read voltages Vrs on the basis of the soft read data S_DATA. The detection data may be the number of data having a predetermined logic value among data read by the soft read voltages Vrs. The predetermined logic value may be one of '1' and '0'.

The read voltage setting circuit 230 may generate voltage interval data according to each of the plurality of soft read voltages Vrs. The voltage interval data may have an absolute value obtained by subtracting detection data corresponding to each of two adjacent soft read voltages from each other.

In accordance with an embodiment, a plurality of soft read voltages Vrs may correspond to a default read voltage Vrd. More specifically, the read voltage setting circuit 230 may count memory cells having threshold voltages within voltage intervals defined by the plurality of soft read voltages Vrs and the default read voltage Vrd.

The read voltage setting circuit 230 may select at least two of the plurality of soft read voltages as voltage candidates in ascending order by voltage interval data value. The read voltage setting circuit 230 may select, among the voltage candidates, a voltage candidate having a smallest sum of adjacent voltage interval data as an optimal read voltage. The sum of the adjacent voltage interval data may be a sum of voltage interval data of adjacent voltage intervals to a voltage interval corresponding to each voltage candidate.

Figure 19:
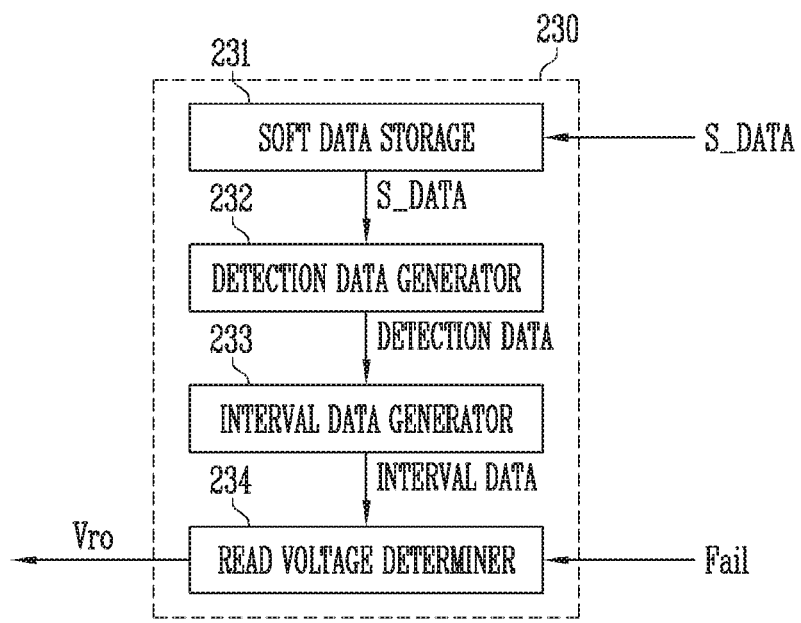
FIG. 19 is a diagram illustrating the structure and operations of a read voltage setting unit of FIG. 18.

FIG. 19 is a diagram illustrating the structure and operations of the read voltage setting circuit 230 of FIG. 18.

Referring to FIG. 19, the read voltage setting circuit 230 may include a soft data storage 231, a detection data generator 232, a voltage interval data generator 233, and a read voltage determiner 234.

The soft data storage 231 may store the soft read data S_DATA obtained by reading the memory cells using the plurality of soft read voltages as described above with reference to FIG. 18. The soft read data S_DATA may be obtained by reading the memory cells using the plurality of soft read voltages Vrs determined based on the default read voltage Vrd used in the failed read operation.

The detection data generator 232 may generate detection data corresponding to each of the plurality of soft read voltages Vrs on the basis of the soft read data S_DATA. The detection data may be the number of data having a predetermined logic value among data read by the soft read voltages Vrs. The detection data generator 232 may include a count circuit for counting data having the predetermined logic value. The predetermined logic value may be one of '1' and '0'.

The voltage interval data generator 233 may generate voltage interval data corresponding to each of the soft read voltages based on the detection data generated by the detection data generator 232. The voltage interval data may have an absolute value of a difference between detection data corresponding to each of two adjacent soft read voltages.

In accordance with an embodiment, voltage interval data may have an absolute value obtained by subtracting detection data corresponding to each of two adjacent soft read voltages from each other.

The voltage interval data generator 233 may include circuits for generating voltage interval data. For example, the voltage interval data generator 233 may include a subtractor for calculating a difference between detection data.

When receiving the fail signal from the fail detector 220 as described above with reference to FIG. 18, the read voltage determiner 234 may determine an optimal read voltage based on the voltage interval data generated by the voltage interval data generator 233.

More specifically, the read voltage determiner 234 may select at least two of the plurality of soft read voltages as voltage candidates in ascending order by voltage interval data value. The read voltage determiner 234 may select, among the voltage candidates, a voltage candidate having a smallest sum of adjacent voltage interval data as an optimal read voltage Vro. The sum of the adjacent voltage interval data may be a sum of voltage interval data of adjacent voltage intervals to a voltage interval corresponding to each voltage candidate.

The read voltage determiner 234 may include circuits for determining an optimal read voltage Vro. For example, the read voltage determiner 234 may include an adder for calculating the sum of the adjacent voltage interval data. The read voltage determiner 234 may include a comparator for comparing the voltage interval data and sums of adjacent voltage interval data.

The read voltage determiner 234 may provide information on the determined optimal read voltage Vro to the read operation controller 210 as described above with reference to FIG. 18.

Figure 20:
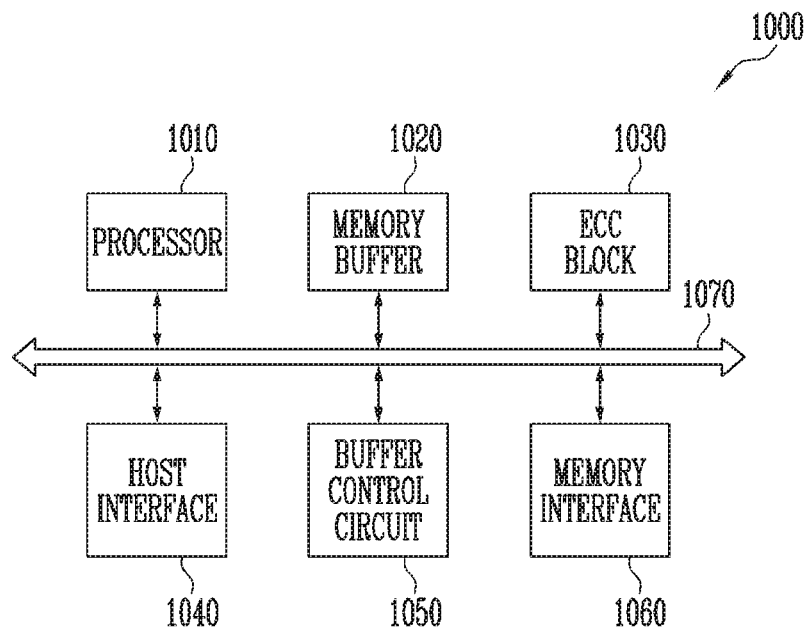
FIG. 20 is a diagram illustrating another embodiment of a memory controller of FIG. 1.

FIG. 20 is a diagram illustrating another embodiment of the memory controller 200 of FIG. 1.

Referring to FIG. 20, the memory controller 1000 may be coupled to a host and the memory device 100. In response to a request from the host, the memory controller 1000 may access the memory device 100. For example, the memory controller 1000 may be configured to control write, read, erase, and background operations of the memory device. The memory controller 1000 may provide an interface between the memory device and the host. The memory controller 1000 may be configured to drive firmware for controlling the memory device.

The memory controller 1000 may include a processor 1010, a memory buffer 1020, an error correction code (ECC) block 1030, a host interface 1040, a buffer control circuit 1050, a memory interface 1060, and a bus 1070.

The bus 1070 may provide a channel between components of the memory controller 1000.

The processor 1010 may control the overall operation of the memory controller 1000 and may perform a logical operation. The processor 1010 may communicate with an external host through the host interface 1040 and communicate with the memory device through the memory interface 1060. Further, the processor 1010 may communicate with the memory buffer 1020 through the buffer control circuit 1050. The processor 1010 may control operations of the storage device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the flash translation layer FTL. The flash translation layer FTL may receive the logical block address LBA and translate the logical block address LBA into the physical block address PBA by using a mapping table. There may be various address mapping methods for the flash translation layer FTL, depending on a mapping unit. Typical address mapping methods may include a page mapping method, a block mapping method and a hybrid mapping method.

The processor 1010 may randomize data received from the host. For example, the processor 1010 may use a randomizing seed to randomize data received from the host. The randomized data may be provided, as data to be stored, to the memory device and may be programmed in the memory cell array.

The processor 1010 may derandomize data received from the memory device during a read operation. For example, the processor 1010 may derandomize the data received from the memory device using a derandomizing seed. The derandomized data may be output to the host.

In accordance with an embodiment, the processor 1010 may run software or firmware to perform randomizing and derandomizing operations.

The memory buffer 1020 may serve as an operation memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC block 1030 may perform error correction. The ECC block 1030 may perform ECC encoding based on data to be written to the memory device through the memory interface 1060. The ECC-encoded data may be transferred to the memory device through the memory interface 1060. The ECC block 1030 may perform ECC decoding based on data received from the memory device through the memory interface 1060. For example, the ECC block 1030 may be included as the component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Non-volatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

For example, the memory controller 1000 may not include the memory buffer 1020 and the buffer control circuit 1050.

For example, the processor 1010 may control the operation of the memory controller 1000 using codes. The processor 1010 may load codes from a non-volatile memory device (e.g., ROM) provided in the memory controller 1000. In another example, the processor 1010 may load codes from the memory device through the memory interface 1060.

For example, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other and may neither interfere with nor influence each other. The data bus may be coupled to the host interface 1040, the buffer control circuit 1050, the ECC block 1030, and the memory interface 1060. The control bus may be coupled to the host interface 1040, the processor 1010, the buffer control circuit 1050, the memory buffer 1020, and the memory interface 1060.

Figure 21:
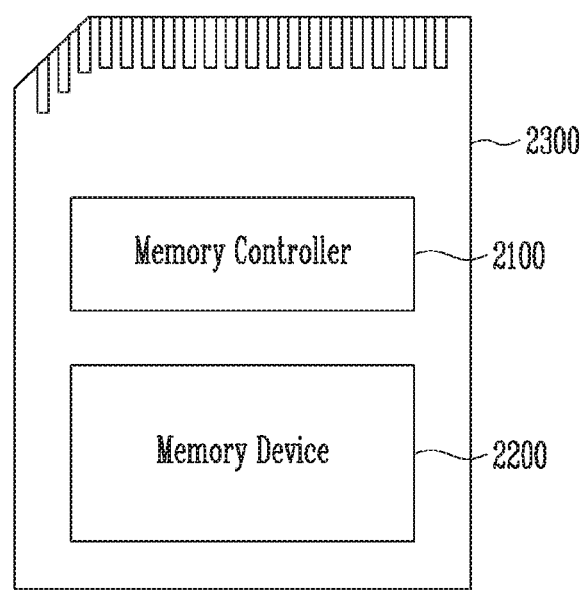
FIG. 21 is a block diagram illustrating a memory card system to which a storage device in accordance with an embodiment of the present disclosure is applied.

FIG. 21 is a block diagram illustrating a memory card system 2000 to which a storage device in accordance with an embodiment is applied.

Referring to FIG. 21, the memory card system 2000 may include a memory controller 2100, a memory device 2200, and a connector 2300.

The memory controller 2100 may be coupled to the memory device 2200. The memory controller 2100 may access the memory device 2200. For example, the memory controller 2100 may be configured to control read, write, erase and background operations of the memory device 2200. The memory controller 2100 may be configured to provide an interface between the memory device 2200 and the host. The memory controller 2100 may be configured to drive firmware for controlling the memory device 2200. The memory device 2200 may have the same configuration as the memory device 100 described above with reference to FIG. 1.

For example, the memory controller 2100 may include components, such as a Random Access Memory (RAM), a processing unit, a host interface, a memory interface, and an ECC block.

The memory controller 2100 may communicate with an external device through the connector 2300. The memory controller 2100 may communicate with an external device (e.g., host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-e or PCIe), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), WiFi, Bluetooth, and non-volatile memory express (NVMe) protocols. For example, the connector 2300 may be defined by at least one of the above-described various communication protocols.

For example, the memory device 2200 may be implemented as any of various non-volatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin-Torque Magnetic RAM (STT-MRAM).

The memory controller 2100 and the memory device 2200 may be integrated into a single semiconductor device to form a memory card. For example, the memory controller 2100 and the memory device 2200 may be integrated into a single semiconductor device and form a memory card, such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

Figure 22:
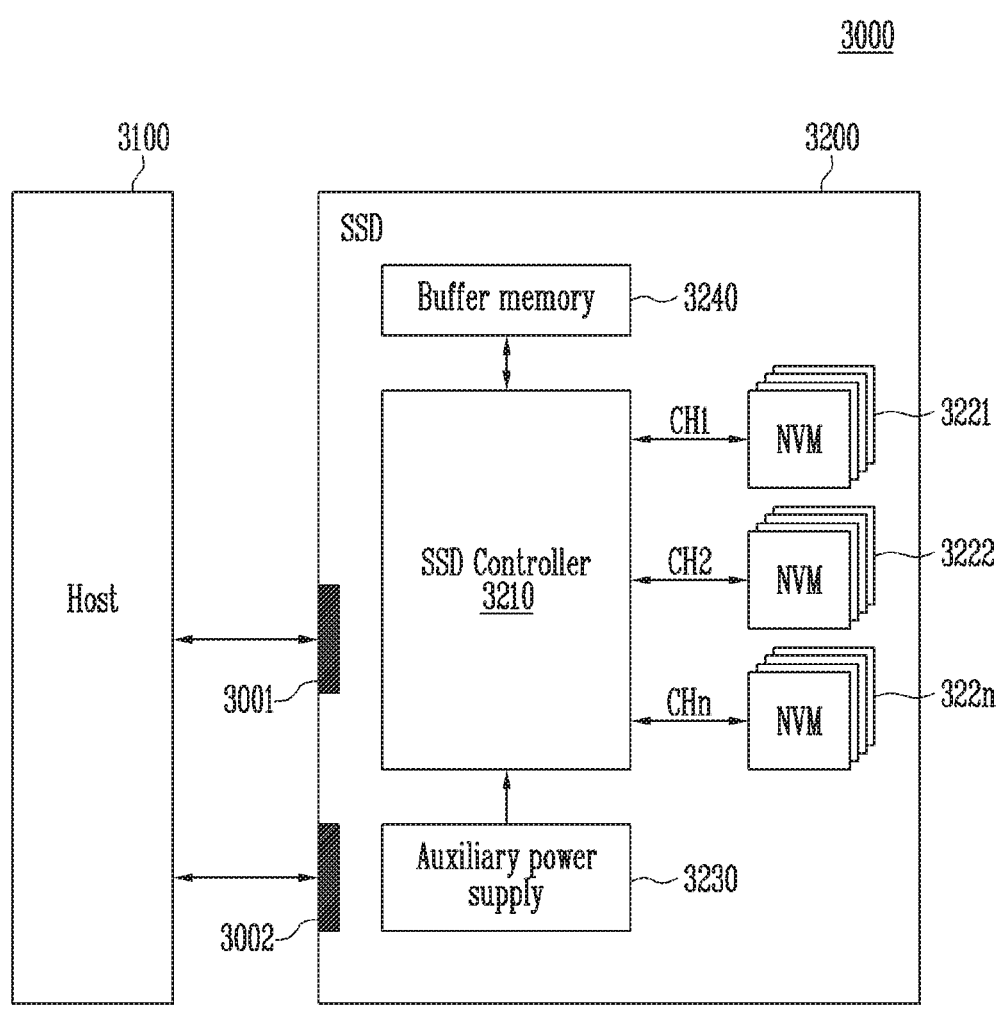
FIG. 22 is a block diagram illustrating a solid state drive (SSD) system to which a storage device in accordance with an embodiment of the present disclosure is applied.

FIG. 22 is a block diagram illustrating a solid state drive (SSD) system 3000 to which a storage device in accordance with an embodiment of the present disclosure is applied.

Referring to FIG. 22, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In accordance with an embodiment, the SSD controller 3210 may perform the function of the memory controller 200 as described above with reference to FIG. 1.

The SSD controller 3210 may control the plurality of flash memories 3221 to 322n in response to the signals SIG received from the host 3100. In accordance with an embodiment, the signals SIG may be based on the interfaces of the host 3100 and the SSD 3200. For example, the signals SIG may be defined by at least one of various interfaces such as universal serial bus (USB), multimedia card (MMC), embedded MMC (eMMC), peripheral component interconnection (PCI), PCI-express (PCIe), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), WiFi, Bluetooth, and non-volatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when power is not smoothly supplied from the host 3100. In an embodiment, the auxiliary power supply 3230 may be positioned inside or outside the SSD 3200. For example, the auxiliary power supply 3230 may be disposed in a main board and may supply auxiliary power to the SSD 3200.

The buffer memory 3240 may function as a buffer memory of the SSD 3200. For example, the buffer memory 3240 may temporarily store data received from the host 3100 or data received from the plurality of flash memories 3221 to 322n, or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or non-volatile memories such as FRAM, ReRAM, STT-MRAM, and PRAM.

Figure 23:
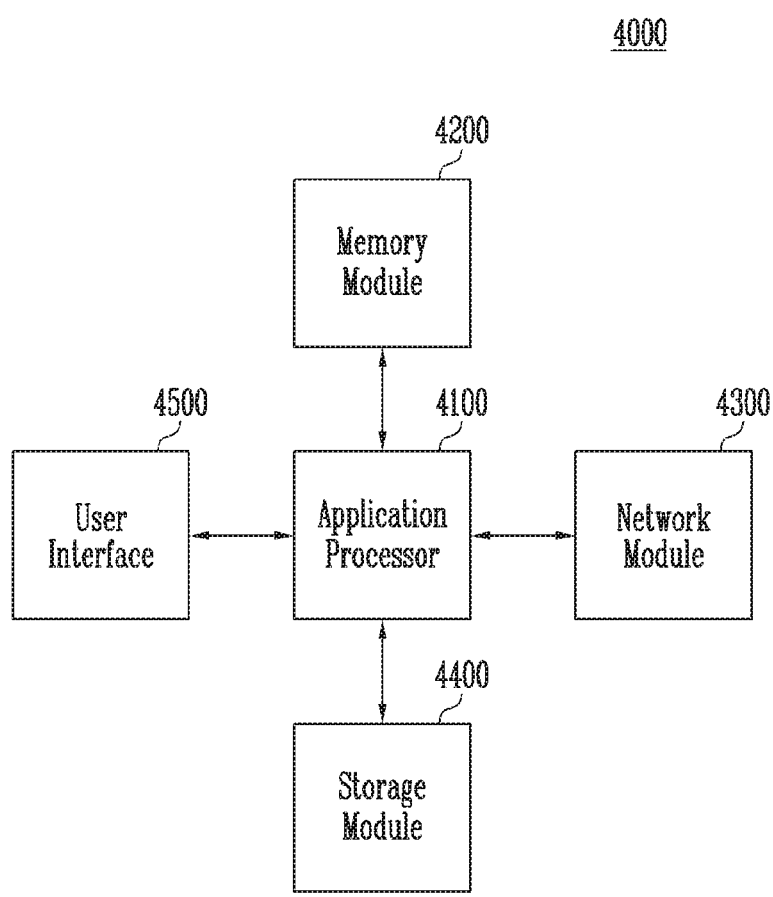
FIG. 23 is a block diagram illustrating a user system to which a storage device in accordance with an embodiment of the present disclosure is applied.

FIG. 23 is a block diagram illustrating a user system 4000 to which the storage device 50 in accordance with an embodiment is applied.

Referring to FIG. 23, the user system 4000 may include an application processor 4100, a memory module 4200, a network module 4300, a storage module 4400, and a user interface 4500.

The application processor 4100 may run components included in the user system 4000, an Operating System (OS), or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDARM, LPDDR3 SDRAM, and LPDDR3 SDRAM or non-volatile RAMs such as PRAM, ReRAM, MRAM, and FRAM. For example, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), Wimax, WLAN, UWB, Bluetooth, or WiFi communication. For example, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In accordance with an embodiment, the storage module 4400 may be implemented as a non-volatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In accordance with an embodiment, the storage module 4400 may include a plurality of non-volatile memory devices, and the plurality of non-volatile memory devices may be operated in the same manner as the memory device as described above with reference to FIG. 1. The storage module 4400 may operate in the same manner as the storage device 50 described above with reference to FIG. 1.

The user interface 4500 may include interfaces which input data or instructions to the application processor 4100 or output data to an external device. In accordance with an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a motor.

In accordance with the present disclosure, a storage device determining an optimal read voltage with more accuracy and an operating method thereof may be provided.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

It should be understood that many variations and modifications of the basic inventive concept described herein will still fall within the spirit and scope of the present disclosure as defined in the accompanying claims and equivalents thereof.

Thus, it is intended that the present invention cover all such modifications provided they come within the scope of the appended claims and their equivalents.

In the above-discussed embodiments, all steps may be selectively performed or skipped. In addition, the steps in each embodiment may not always be performed in uniform order. Furthermore, the embodiments disclosed in the present specification and the drawings aim to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the accompanying claims and equivalents thereof.

What is claimed is:

1. A memory controller controlling a memory device including a plurality of memory cells, the memory controller comprising:
    a read operation controller configured to perform a soft read operation on the plurality of memory cells by using a plurality of soft read voltages determined based on a default read voltage when a read operation for reading the plurality of memory cells by the default read voltage fails, and to read the plurality of memory cells by using an optimal read voltage determined according to a result of performing the soft read operation; and
    a read voltage setting circuit configured to determine the optimal read voltage by using voltage candidates that are soft read voltages corresponding to at least two voltage intervals, among a plurality of voltage intervals determined according to the plurality of soft read voltages,
    wherein the voltage candidates are selected in ascending order of a number of memory cells having threshold voltages belonging to each of the plurality of voltage intervals, and
    wherein the read voltage setting circuit comprises:
        a detection data generator configured to generate detection data corresponding to each of the plurality of soft read voltages based on the result of performing the soft read operation;
        a voltage interval data generator configured to generate voltage interval data corresponding to each of the plurality of soft read voltages based on the detection data; and
        a read voltage determiner configured to determine one of the voltage candidates as the optimal read voltage based on the voltage interval data.

2. The memory controller of claim 1, wherein the detection data indicates a number of data having a predetermined logic value included in data read by one of the plurality of soft read voltages.

3. The memory controller of claim 2, wherein the voltage interval data has an absolute value obtained by subtracting detection data corresponding to each of two adjacent soft read voltages from each other.

4. The memory controller of claim 3, wherein the read voltage determiner selects at least two of the plurality of soft read voltages as the voltage candidates in ascending order from smallest voltage interval data and determines the optimal read voltage using voltage interval data corresponding to soft read voltages adjacent to the voltage candidates.

5. The memory controller of claim 1, further comprising a fail detector configured to generate a fail signal and providing the read operation controller with the fail signal when error correction decoding on the result of performing the read operation fails.

6. The memory controller of claim 5, wherein the read voltage determiner performs the soft read operation when receiving the fail signal.

7. The memory controller of claim 2, wherein the predetermined logic value is one of '1' and '0'.

8. The memory controller of claim 1, wherein the plurality of soft read voltages have a uniform voltage interval.

9. The memory controller of claim 1, wherein the plurality of soft read voltages have increasing or decreasing offsets with reference to the default read voltage.

10. The memory controller of claim 1, wherein the plurality of soft read voltages have different offsets with reference to the default read voltage.

11. An operating method for a memory controller controlling a memory device including a plurality of memory cells, the operating method comprising:
    performing a read operation on the plurality of memory cells by using a default read voltage;
    performing a soft read operation on the plurality of memory cells by using a plurality of soft read voltages determined based on the default read voltage when the read operation fails;
    determining an optimal read voltage using voltage candidates based on a result of performing the soft read operation; and
    reading the plurality of memory cells by the optimal read voltage, wherein the voltage candidates are soft read voltages corresponding to at least two voltage intervals selected in ascending order of a number of memory cells having threshold voltages belonging to each of a plurality of voltage intervals determined according to the plurality of soft read voltages, and wherein the determining of the optimal read voltage comprises:

generating detection data corresponding to each of the plurality of soft read voltages based on the result of performing the soft read operation;

generating voltage interval data corresponding to each of the plurality of soft read voltages based on the detection data; and determining one of the voltage candidates as the optimal read voltage based on the voltage interval data.

12. The operating method of claim 11, wherein the generating of the detection data comprises generating the detection data showing a number of data having a predetermined logic value included in data read by each of the plurality of soft read voltages, wherein the generating of the voltage interval data comprises generating the voltage interval data according to each of the plurality of soft read voltages, the voltage interval data having an absolute value obtained by subtracting detection data corresponding to each of two adjacent soft read voltages from each other, and wherein the determining of one of the voltage candidates as the optimal read voltage comprises:

selecting at least two soft read voltages, among the plurality of soft read voltages, as the voltage candidates in ascending order from a smallest value of the voltage interval data; and determining the optimal read voltage using voltage interval data corresponding to soft read voltages adjacent to the voltage candidates.

13. The operating method of claim 12, wherein the predetermined logic value is one of '1' and '0'.

14. The operating method of claim 11, wherein the plurality of soft read voltages have a uniform voltage interval.

15. The operating method of claim 11, wherein the plurality of soft read voltages have different offsets with reference to the default read voltage.

16. A storage device comprising:

a memory device configured to perform a read operation on a plurality of memory cells and providing a result of performing the read operation; and a memory controller configured to:

provide the memory device with a read command instructing a soft read operation on the plurality of memory cells by using a plurality of soft read voltages determined based on a default read voltage when a read operation on the plurality of memory cells by the default read voltage fails;

select at least two voltage intervals, among a plurality of voltage intervals determined by the plurality of soft read voltages, as voltage interval candidates in ascending order of a number of memory cells having threshold voltages belonging to each of the plurality of voltage intervals;

determine a soft read voltage corresponding to one of the voltage interval candidates as an optimal read voltage by using a number of memory cells having threshold voltages belonging to voltage intervals adjacent to the voltage interval candidates; and provide the memory device with a read command on the plurality of memory cells which uses the optimal read voltage, wherein the memory controller generates detection data corresponding to each of the plurality of soft read voltages based on a result of performing the soft read operation, wherein the memory controller generates voltage interval data corresponding to each of the plurality of soft read voltages based on the detection data, and wherein the memory controller determines the soft read voltage corresponding to the one of the voltage interval candidates as the optimal read voltage based on the voltage interval data.

17. The storage device of claim 16, wherein the plurality of soft read voltages have a uniform voltage interval.

18. The storage device of claim 16, wherein the plurality of soft read voltages have increasing or decreasing offsets with reference to the default read voltage.

19. The storage device of claim 16, wherein the plurality of soft read voltages have different offsets with reference to the default read voltage.

* * * * *